(12) United States Patent
Kato et al.

(10) Patent No.: US 10,221,480 B2
(45) Date of Patent: Mar. 5, 2019

(54) SUBSTRATE PROCESSING APPARATUS AND SUBSTRATE PROCESSING METHOD

(71) Applicant: TOKYO ELECTRON LIMITED, Tokyo (JP)

(72) Inventors: Hitoshi Kato, Oshu (JP); Yukio Ohizumi, Oshu (JP); Manabu Honma, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 22 days.

(21) Appl. No.: 15/255,565

(22) Filed: Sep. 2, 2016

(65) Prior Publication Data

US 2017/0067160 A1 Mar. 9, 2017

(30) Foreign Application Priority Data

Sep. 8, 2015 (JP) .................................. 2015-176692

(51) Int. Cl.
| | |
|---|---|
| *C23C 16/44* | (2006.01) |
| *H01L 21/67* | (2006.01) |
| *C23C 16/455* | (2006.01) |
| *C23C 16/458* | (2006.01) |
| *H01L 21/687* | (2006.01) |
| *C23C 16/40* | (2006.01) |
| *H01L 21/02* | (2006.01) |

(52) U.S. Cl.
CPC ...... *C23C 16/45551* (2013.01); *C23C 16/402* (2013.01); *C23C 16/4584* (2013.01);
(Continued)

(58) Field of Classification Search
CPC ............ C23C 16/45551; C23C 16/402; C23C 16/45536; C23C 16/45578;
(Continued)

(56) References Cited

U.S. PATENT DOCUMENTS 3,783,822 A * 1/1974 Wollam .............. C23C 16/4584
118/725
5,795,448 A * 8/1998 Hurwitt ............... H01L 21/6715
118/729

(Continued)

FOREIGN PATENT DOCUMENTS

| JP | 452275 A | 2/1992 |
| JP | 04302138 A * | 10/1992 |
| JP | 2009-170822 A | 7/2009 |

*Primary Examiner* — Charlee J C Bennett
(74) *Attorney, Agent, or Firm* — Nath, Goldberg & Meyer; Jerald L. Meyer

(57) ABSTRACT

There is provided a substrate processing apparatus for processing a substrate by supplying a processing gas to the substrate while revolving the substrate, the substrate processing apparatus including: a rotary table installed within a processing container; a rotating mechanism configured to rotate the rotary table; a support part installed in a rotary shaft of the rotary table below the rotary table; an opening portion formed in the rotary table to correspond to a mounting position where the substrate is mounted; a mounting part rotatably supported by the support part through the opening portion, and configured to mount the substrate thereon such that a height level of an upper surface of the substrate coincides with a height level of an upper surface of the rotary table; and a rotating mechanism configured to rotate the mounting part.

5 Claims, 21 Drawing Sheets

(52) U.S. Cl.
CPC .. *C23C 16/45536* (2013.01); *C23C 16/45578* (2013.01); *H01L 21/68764* (2013.01); *H01L 21/68771* (2013.01); *H01L 21/68792* (2013.01); *H01L 21/0228* (2013.01); *H01L 21/02164* (2013.01)

(58) Field of Classification Search
CPC ........... C23C 16/4584; H01L 21/68764; H01L 21/68771; H01L 21/68792; H01L 21/02164; H01L 21/0228
USPC ........................................................ 118/730
See application file for complete search history.

(56) References Cited

U.S. PATENT DOCUMENTS

| | | | |
|---|---|---|---|
| 5,871,588 A * | 2/1999 | Moslehi | C23C 16/4584 118/500 |
| 6,454,908 B1 * | 9/2002 | Schertler | H01L 21/68764 118/719 |
| 6,592,675 B2 * | 7/2003 | Nishikawa | C23C 16/4584 118/500 |
| 2003/0005948 A1 * | 1/2003 | Matsuno | B08B 3/04 134/33 |
| 2010/0055351 A1 * | 3/2010 | Kato | C23C 16/45521 427/595 |
| 2010/0322603 A1 * | 12/2010 | Shim | H01L 21/68764 392/418 |
| 2012/0145080 A1 * | 6/2012 | Park | C23C 16/4412 118/725 |
| 2014/0110253 A1 * | 4/2014 | Tamagaki | C23C 16/509 204/298.06 |
| 2016/0122872 A1 * | 5/2016 | Kato | C23C 16/4409 427/8 |
| 2016/0138159 A1 * | 5/2016 | Kato | C23C 16/4584 118/730 |
| 2017/0218514 A1 * | 8/2017 | Kato | C23C 16/4584 |
| 2018/0037990 A1 * | 2/2018 | Kato | C23C 16/45527 |
| 2018/0251892 A1 * | 9/2018 | Kobayashi | C23C 16/4584 |

* cited by examiner

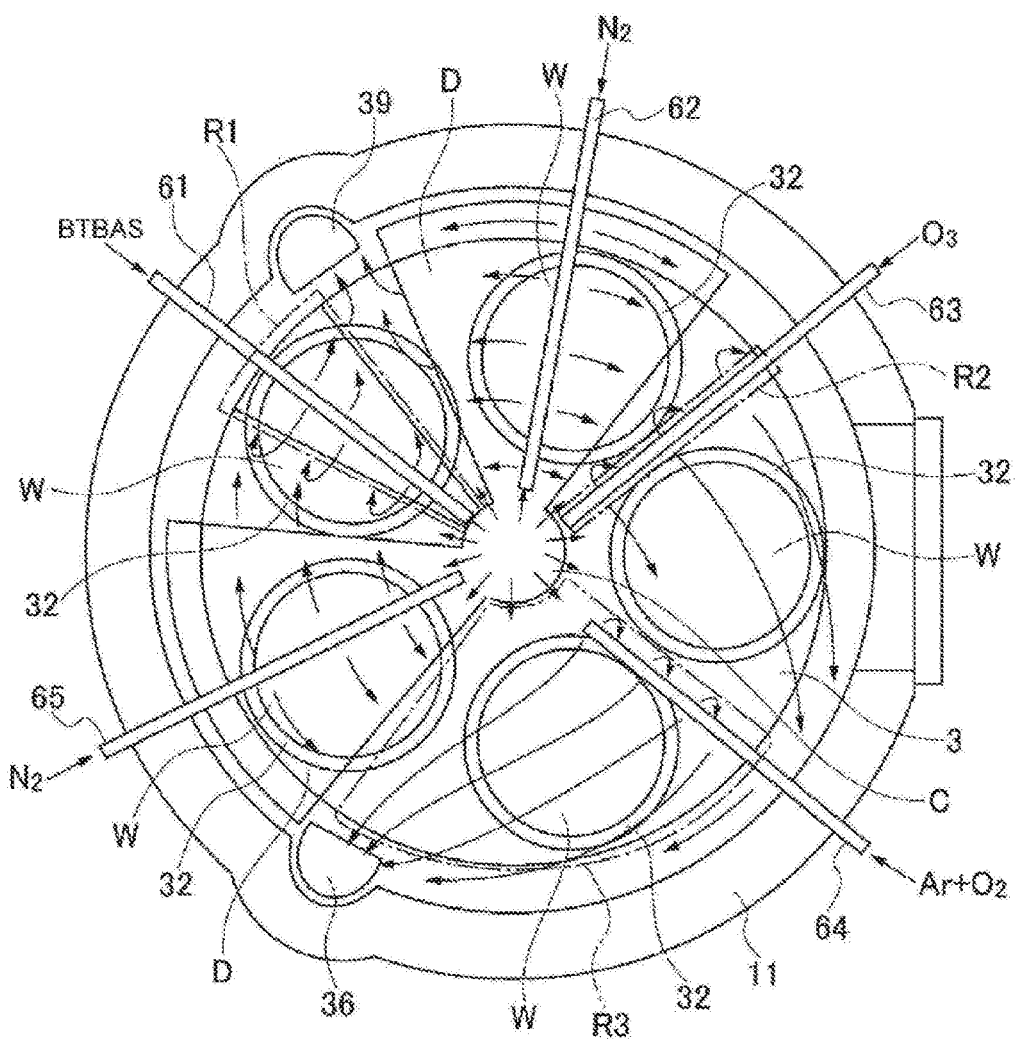

SUBSTRATE PROCESSING APPARATUS AND SUBSTRATE PROCESSING METHOD

CROSS-REFERENCE TO RELATED APPLICATION

This application claims the benefit of Japanese Patent Application No. 2015-176692, filed on Sep. 8, 2015, in the Japan Patent Office, the disclosure of which is incorporated herein in its entirety by reference.

TECHNICAL FIELD

The present disclosure relates to a technique for performing a process on a substrate by supplying a processing gas to the substrate while revolving the substrate.

BACKGROUND

In a semiconductor device manufacturing process, for example, an atomic Layer Deposition (ALD) is performed to form various films for forming an etching mask or the like, on a semiconductor wafer as a substrate (hereinafter, referred to as a "wafer"). In order to enhance the productivity of semiconductor devices, the ALD is sometimes performed by an apparatus that rotates a rotary table on which a plurality of wafers is mounted, while revolving the wafers, and repeatedly passes the wafers through a processing gas supply region (process region) defined along a diametric direction of the rotary table.

With the miniaturization of a wiring constituting a semiconductor device, it is sometimes requested to perform a film formation process at a high uniformity such that, for example, film thicknesses of respective portions in a surface of a wafer deviate within a range of 1% or less from a target value. In addition, with the miniaturization of the wiring, a loading effect within the surface of the wafer is relatively large during an etching process. As such, for example, there is sometimes a desire to form a film thickness distribution of a concentric circular shape in which, for example, a film thickness of the central portion of the wafer is larger than that of the peripheral portion of the wafer. That is to say, it is requested that the film formation process is performed at a high uniformity in the circumferential direction of the wafer.

In the film formation apparatus that revolves the wafers, however, because the processing gas is supplied along the diametric direction of the rotary table, the thickness distribution of a film formed on the respective wafer tends to vary from the central side of the rotary table toward the peripheral side of the rotary table. This makes it difficult to form a film thickness distribution having a high uniformity in the circumferential direction of the wafer. For example, there is known a film formation apparatus which forms a predetermined temperature distribution within a surface of a wafer, and performs a chemical vapor deposition (CVD), thus forming a film thickness distribution of a concentric circular shape as described above. However, in this film formation apparatus, the wafer is not revolved during the film formation process. As such, this apparatus fails to address the above problems.

In order to improve the uniformity of film thickness in a circumferential direction of a wafer, a film formation apparatus provided with the aforementioned rotary table is under consideration in which a rotating mechanism for rotating a mounting stand on which the wafer is mounted, in the circumferential direction, is installed in the rotary table. However, in the film formation apparatus configured as above, a load caused by a rotating mechanism is applied to the rotary table in addition to a centrifugal force caused by the rotation of the mounting stand. Therefore, in order to prevent a breakage of the rotary table, it is considered that the rotary table is required to be formed by a relatively strong material (e.g., a metal such as aluminum (Al)). When the rotary table is formed of the metal, it is necessary to perform a film formation process on the wafer at a relatively low temperature (e.g., a temperature of 200 degrees C. or less) in order to prevent deformation by heat. This makes it impossible to form desired kinds of films or a film having a desired film quality.

SUMMARY

Some embodiments of the present disclosure provide a technique which is capable of performing a process on a substrate at a high uniformity in a circumferential direction of the substrate and suppressing a load applied to the rotary table, in a substrate processing apparatus which processes the substrate by supplying a processing gas to the substrate while revolving the substrate by the rotary table.

According to one embodiment of the present disclosure, there is provided a substrate processing apparatus for processing a substrate by supplying a processing gas to the substrate while revolving the substrate, the substrate processing apparatus including: a rotary table installed within a processing container; a rotating mechanism configured to rotate the rotary table; a support part installed in a rotary shaft of the rotary table below the rotary table; an opening portion formed in the rotary table to correspond to a mounting position where the substrate is mounted; a mounting part rotatably supported by the support part through the opening portion, and configured to mount the substrate thereon such that a height level of an upper surface of the substrate coincides with a height level of an upper surface of the rotary table; and a rotating mechanism configured to rotate the mounting part.

According to another embodiment of the present disclosure, there is provided a substrate processing method for processing a substrate by supplying a processing gas to the substrate while revolving the substrate, the substrate processing method including: rotating a rotary table installed within the processing container by a rotating mechanism; rotatably supporting a mounting part by a support part installed in a rotary shaft of the rotary table below the rotary table through an opening portion formed in the rotary table to correspond to a mounting position at which the substrate is mounted; mounting the substrate on the mounting part such that a height level of an upper surface of the substrate coincides with a height level of an upper surface of the rotary table; and rotating the mounting part by a rotation mechanism.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 25 is an explanatory view illustrating flows of respective gases supplied to a vacuum container.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Descriptions will be made on a film formation apparatus 1 as an embodiment of a substrate processing apparatus of the present disclosure, which performs ALD on a wafer W used as a substrate. The film formation apparatus 1 allows a bis-tertiary butylaminosilane (BTBAS) gas as a raw material gas that is a processing gas containing silicon (Si) to be adsorbed onto the wafer W, supplies an ozone ($O_3$) gas as an oxidizing gas for oxidizing the absorbed BTBAS gas, forms a molecular layer of silicon oxide ($SiO_2$), and exposes the molecular layer to plasma generated from a plasma generating gas in order to modify the molecular layer. Such a series of processes are repeated to form an $SiO_2$ film.

Figure 1:
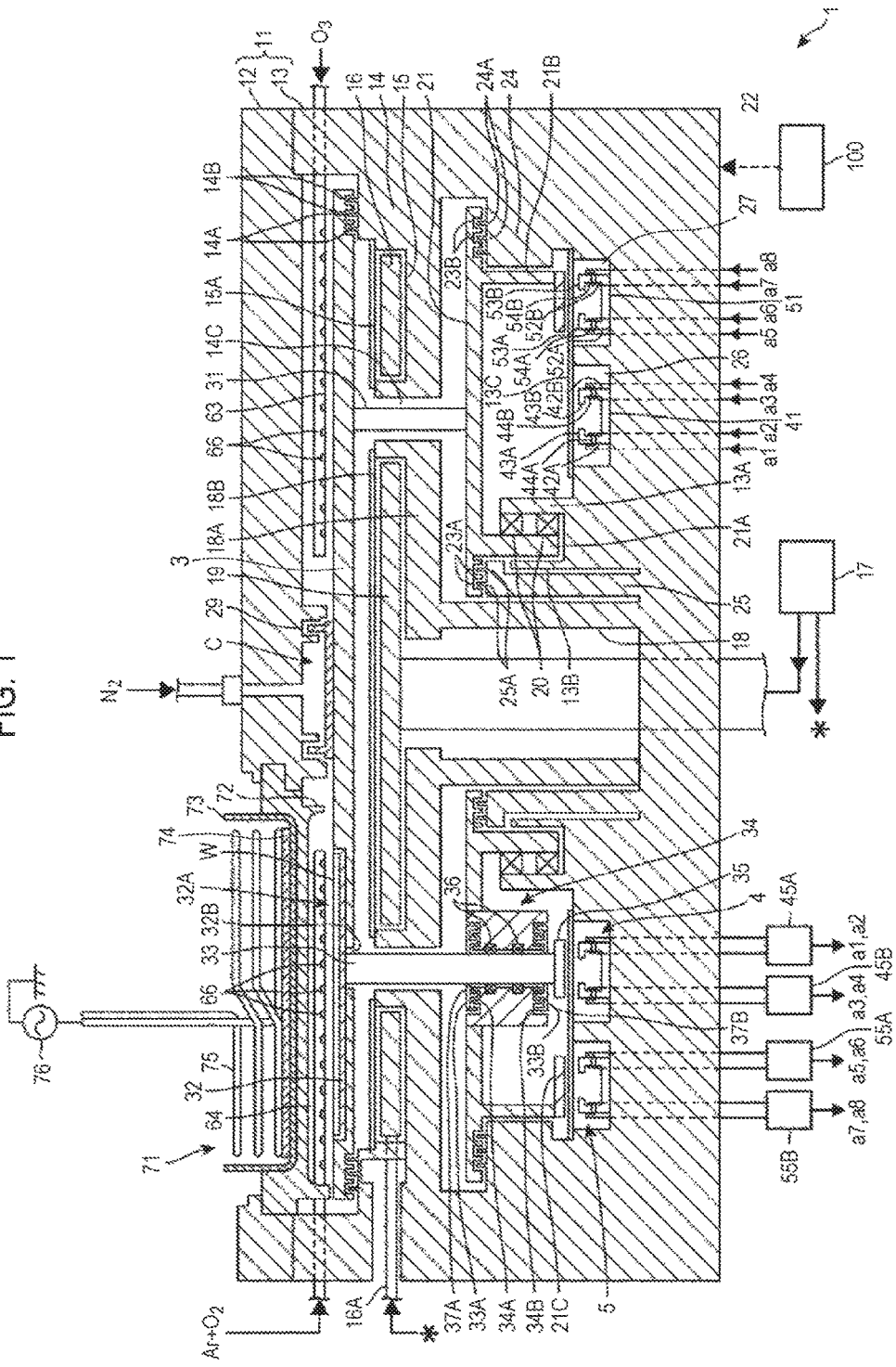
FIG. 1 is a vertical sectional view of a film formation apparatus according to an embodiment of a substrate processing apparatus of the present disclosure.
Figure 2:
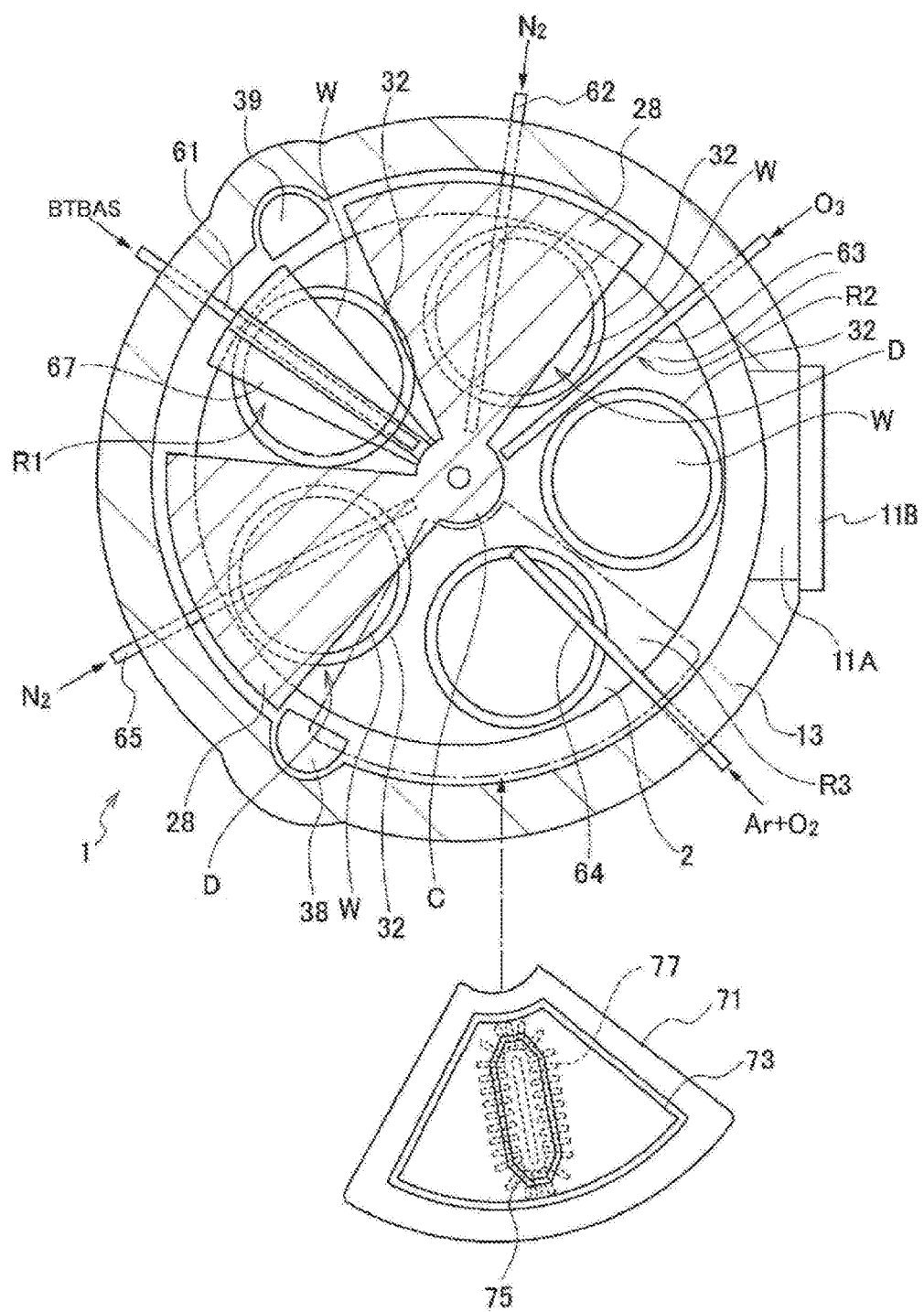
FIG. 2 is a transverse plan view of the film formation apparatus.
Figure 3:
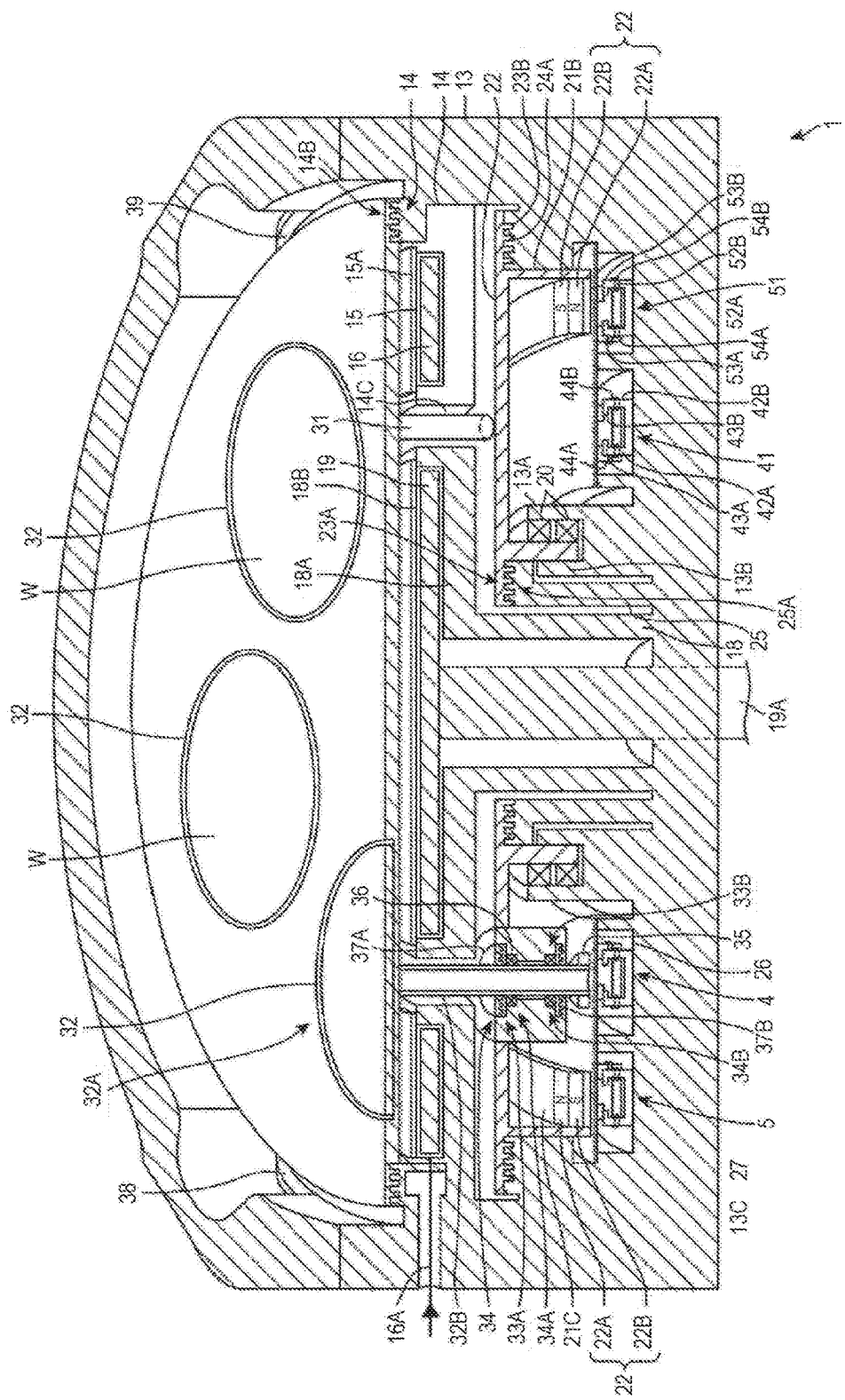
FIG. 3 is a vertical sectional perspective view of the film formation apparatus.

FIGS. 1 to 3 are a vertical sectional view, a transverse plan view, and a vertical sectional perspective view of the film formation apparatus 1, respectively. The film formation apparatus 1 includes a flat vacuum container (processing container) 11 of a substantially circular shape, and a disc-shaped horizontal rotary table (susceptor) 3 installed in the vacuum container 11. The vacuum container 11 includes a ceiling plate 12 and a container body 13 that constitutes a sidewall and a bottom portion of the vacuum container 11.

The rotary table 3 is made of, for example, quartz, to suppress the rotary table 3 from being deformed even if the rotary table 3 is heated at a relatively high temperature. The rotary table 3 rotates clockwise in a circumferential direction when viewed from the top (to be described later). The sidewall of the container body 13 protrudes toward a rear surface of the rotary table 3 to form an upper end side protrusion 14 of a ring shape when viewed from the top. A recess 15 is formed along the circumference of the upper end side protrusion 14 in the upper end side protrusion 14. A ring-shaped heater 16 is installed within the recess 15 along the circumference of the rotary table 3 to heat a peripheral portion of the rotary table 3. In the drawings, reference numeral "15A" indicates a cover for blocking the recess 15 from above. In the drawings, reference numeral "16A" indicates a power feeding line for feeding power to the heater 16. The power feeding line 16A is connected to the heater 16. The power feeding line 16A penetrates through the sidewall of the vacuum container 11 and is drawn out of the vacuum container 11. The power feeding line 16A is connected to a power source 17.

In the drawings, reference numerals "14A" indicate convex portions formed to protrude upward from the upper end side protrusion 14 outward of the recess 15. The plurality of convex portions 14A is positioned along a concentric circle centered at a rotary shaft of the rotary table 3. The convex portions 14A are formed to enter a plurality of concave portions 14B formed in the peripheral portion of the rear surface of the rotary table 3, respectively. The plurality of concave portions 14B is formed along a concentric circle in a rotational direction of the rotary table 3. The convex portions 14A and the concave portions 14B are formed to prevent the processing gas supplied toward the front surface of the rotary table 3 from flowing around the rear surface of the rotary table 3.

A cylindrical portion 18 is installed to extend upward from a bottom central portion of the container body 13. An upper end of the cylindrical portion 18 is extended outward to form a flange 18A. A peripheral portion of the flange 18A protrudes upward to form a recess 18B. For example, a disc-shaped heater 19 is installed in the recess 18B to heat the central portion of the rotary table 3. In the drawings, reference numeral "18C" indicates a cover for blocking the recess 18B from above. In the drawings, reference numeral "19A" indicates a power feeding line for feeding power to the heater 19. The power feeding line 19A extends downward from the heater 19 and penetrates through the inside of the cylindrical portion 18. The power feeding line 19A is drawn out of the vacuum container 11 through the bottom portion of the vacuum container 11 and is connected to a power source 17. The rotary table 3 is heated in its entirety by radiant heat caused from the heaters 16 and 19. That is to say, in the film formation apparatus 1, heaters for heating the rotary table 3 are installed in both the center portion of the rotary table 3 and the peripheral portion thereof.

A portion between the flange 18A and the upper end side protrusion 14 constitutes a ring-shaped slit 14C. A horizontal circular ring plate 21 is installed below the flange 18A and the upper end side protrusion 14 to surround the cylindrical portion 18. In a bottom surface of the ring plate 21 used as a support portion, an inner protrusion 21A and an outer protrusion 21B are formed along a concentric circle centered at the center of the ring plate 21. In addition, a protrusion 13A formed along the circumference of the ring plate 21 is formed outside the inner protrusion 21A in the bottom portion of the container body 13. Bearings 20 are installed between the inner protrusion 21A and the protrusion 13A. By the bearing 20, the ring plate 21 is supported on the container body 13 such that the ring plate 21 can be rotated in the circumferential direction. With the rotation of the ring plate 21, the rotary table 3 is also rotated. Thus, it can be said that the inner protrusion 21A constitutes the rotary shaft of the rotary table 3, and a portion constituting a horizontal plate of the ring plate 21 is installed on the rotary shaft of the rotary table 3.

Figure 4:
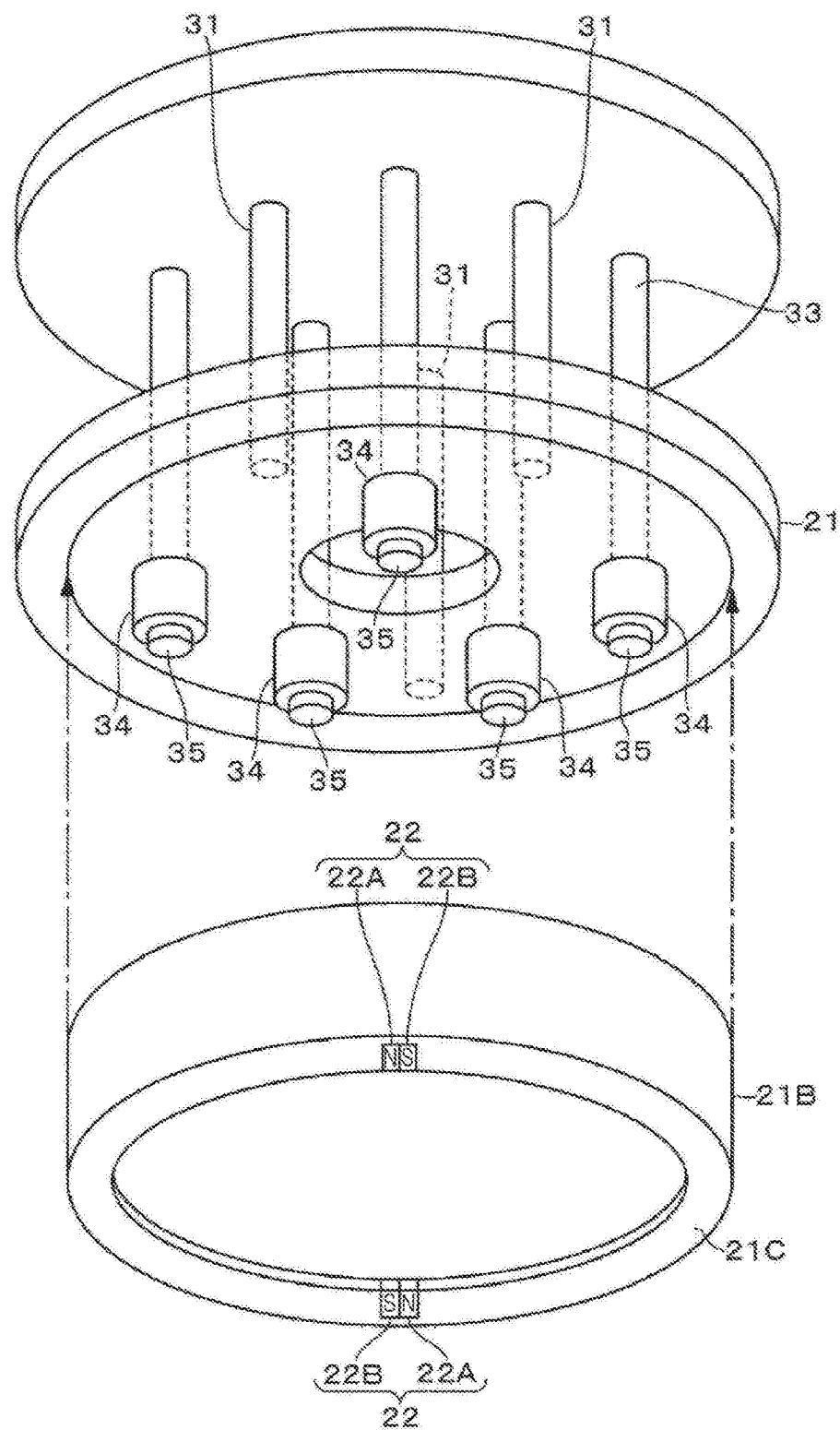
FIG. 4 is a perspective view of rear sides of a rotary table and a ring plate which are installed in the film formation apparatus.

FIG. 4 is a perspective view of rear sides of the ring plate 21 and the rotary table 3. Descriptions will be continued with reference to FIG. 4. For the sake of convenience in description, the inner protrusion 21A and grooves 23A and 23B (to be described later) are omitted in FIG. 4. A lower end portion of the outer protrusion 21B extends inward to form a flange 21C. For example, two magnets 22 are installed in the flange 21C to be spaced apart from each other in the circumferential direction. The magnets 22 are permanent magnets. A magnetic pole 22A as an N-pole and a magnetic pole 22B as an S-pole that constitutes each of the magnets 22 are arranged along the circumferential direction of the flange 21C (i.e. the rotational direction of the ring plate 21).

In the bottom surface of the ring plate 21, the plurality of grooves 23A and the plurality of grooves 23B are concentrically formed along the circumference of the ring plate 21 in an inner peripheral portion more inward of the inner protrusion 21A, and an outer peripheral portion more outward of the outer protrusion 21B, respectively. In addition, a portion of the sidewall of the container body 13 constitutes a ring-shaped lower end side protrusion 24 formed to protrude slightly inward when viewed from the top, in the lower portion of the upper end side protrusion 14. In the top surface of the lower end side protrusion 24, a plurality of protrusions 24A is concentrically formed along the circumference of the ring plate 21 to enter into the respective grooves 23B.

Further, an outer cylindrical part 25 is installed to extend upward from the bottom portion of the container body 13 and to surround the outside of the cylindrical portion 18. An upper end of the outer cylindrical part 25 is formed to extend slightly outward in a radial direction. In the top surface of the upper end of the outer cylindrical part 25, a plurality of protrusions 25A is concentrically formed along the circumference of the ring plate 21 to enter into the respective grooves 23A. In addition, in the drawings, reference numeral "13B" indicates a cylindrical protrusion. This protrusion 13B is formed between the outer cylindrical part 25 and the inner protrusion 21A in the bottom portion of the container body 13 and is located near the outer cylindrical part 25 and the inner protrusion 21A.

In the bottom portion of the container body 13, recesses 26 and 27 are concentrically formed around the rotary shaft of the ring plate 21 in the outside of the protrusion 13A. The recess 26 is positioned below the slit 14C, and the recess 27 is positioned below a movement path of the magnets 22 of the ring plate 21. In the drawing, "13C" indicates a cover for blocking the recesses 26 and 27 from above. The grooves 23A and 23B and the protrusions 24A and 25A are provided to regulate the flow of the processing gas and to prevent the processing gas from sticking to the bearings 20, plates and the magnets 22 which are installed within the recesses 26 and 27 (to be described later).

Pillars 31 are installed to vertically extend from the top surface of the ring plate 21 up to above the slit 14C. The bottom surface of the rotary table 3 is supported by the pillars 31. The pillars 31 are installed at plural positions to be spaced apart from each other in the circumferential direction of the ring plate 21. In this way, the ring plate 21 and the rotary table 3 are connected to each other by the pillars 31. Thus, when the ring plate 21 rotates in the circumferential direction by a drive unit for revolution 5 as described below, the rotary table 3 also rotates in the circumferential direction.

In the front surface (one surface) of the rotary table 3, five circular recesses are formed along the rotational direction of the rotary table 3. A circular wafer holder 32 is installed in each of the recesses. A recess 32A is formed in a front surface of each of the wafer holders 32. The wafer W is horizontally accommodated within the recess 32A. Accordingly, the wafer holder 32 constitutes a wafer mounting part. A vertical level of the front surface of each of the wafers W mounted on the wafer holders 32 becomes equal to a vertical level of the front surface of the rotary table 3 such that a film formation process is performed with respect to the wafer W and between the wafers W at a high in-plane uniformity and a high wafer in-plane uniformity. A plurality of rotary shafts 33 which rotates the wafer W and rotates together with the respective wafer holders 32, is installed to vertically extend downward from the lower central portion of each of the wafer holders 32 through an opening 32B formed in the bottom surface of the recess of the rotary table 3. A lower end of each of the rotary shafts 33 penetrates through a bearing unit 34 installed in the ring plate 21 and is connected to a respective magnetic gear 35. The magnetic gears 35 are magnets configured in a horizontal ring shape to surround the respective rotary shafts 33. Each of the magnetic gears 35 is configured such that a plurality of (e.g., four) S-poles and a plurality of (e.g., four) N-poles are alternately arranged in the circumferential direction.

The bearing unit 34 is provided with a bearing 36. By the bearing 36, the rotary shaft 33 is rotatable around its center axis and is supported by the ring plate 21. In the drawings, reference numerals "37A" and "37B" indicate flanges installed to be vertically spaced apart from each other in the rotary shaft 33. A plurality of grooves 33A and 33B is concentrically formed below the flange 37A and above the flange 37B in a rotational direction of the rotary shaft 33, respectively. In an upper portion of the bearing unit 34, ring-shaped protrusions 34A which are concentrically formed to correspond to the respective grooves 33A, are formed to enter into the respective grooves 33A. In a lower portion of the bearing unit 34, ring-shaped protrusions 34B which are concentrically formed to correspond to the respective grooves 33B, are formed to enter into the respective grooves 33B. In this way, the protrusions 34A and 34B are inserted into the grooves 33A and 33B, respectively. This prevents the processing gas from flowing into the bearing unit 34.

In the bottom surface of the ceiling plate 12 of the vacuum container 11, there are formed a central region formation portion C which is formed in a circular shape when viewed from the top and protrudes to face the central portion of the rotary table 3, and protrusions 28 and 28 which are formed in a fan shape gradually spreading outward from the central region formation portion C toward the outside of the rotary table 3 when viewed from the top (see FIG. 2). That is to say, the central region formation portion C and the protrusions 28 and 28 constitute a low ceiling surface compared with the outer region. A gap between the central region formation portion C and the central portion of the rotary table 3 constitutes a flow path 29 through which a $N_2$(nitrogen) gas flows.

During the process of the wafer W, the $N_2$ gas is supplied to the flow path 29 from a gas supply pipe connected to the ceiling plate 12, and is discharged over the entire outer circumference of the rotary table 3 through the flow path 29.

The N₂ gas is to prevent the raw material gas and the oxidizing gas from coming in contact with each other on the central portion of the rotary table 3. In addition, exhaust ports 38 and 39 for evacuating the vacuum container 11 are formed outside the rotary table 3 in the bottom surface of the container body 13 when viewed from the top. An exhaust mechanism (not illustrated) which includes a vacuum pump or the like, is connected to the exhaust ports 38 and 39.

Figure 5:
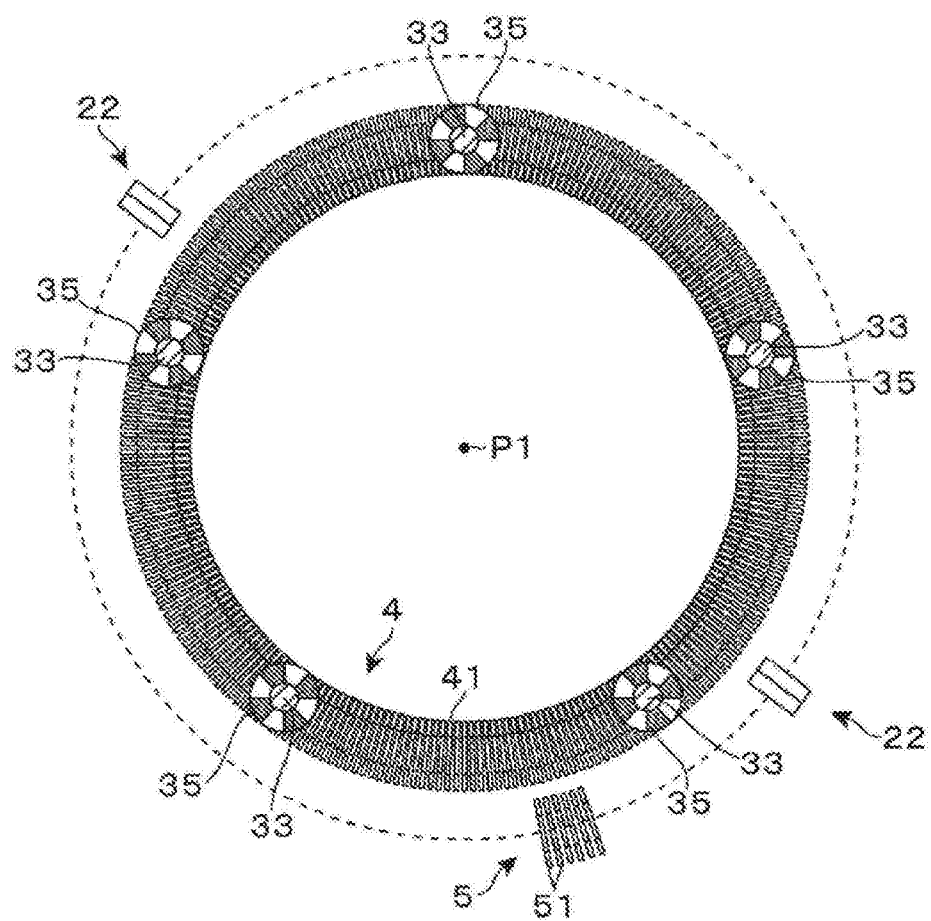
FIG. 5 is a plan view of a drive unit for rotation, a drive unit for revolution, and magnetic gears which are installed in the film formation apparatus.
Figure 6:
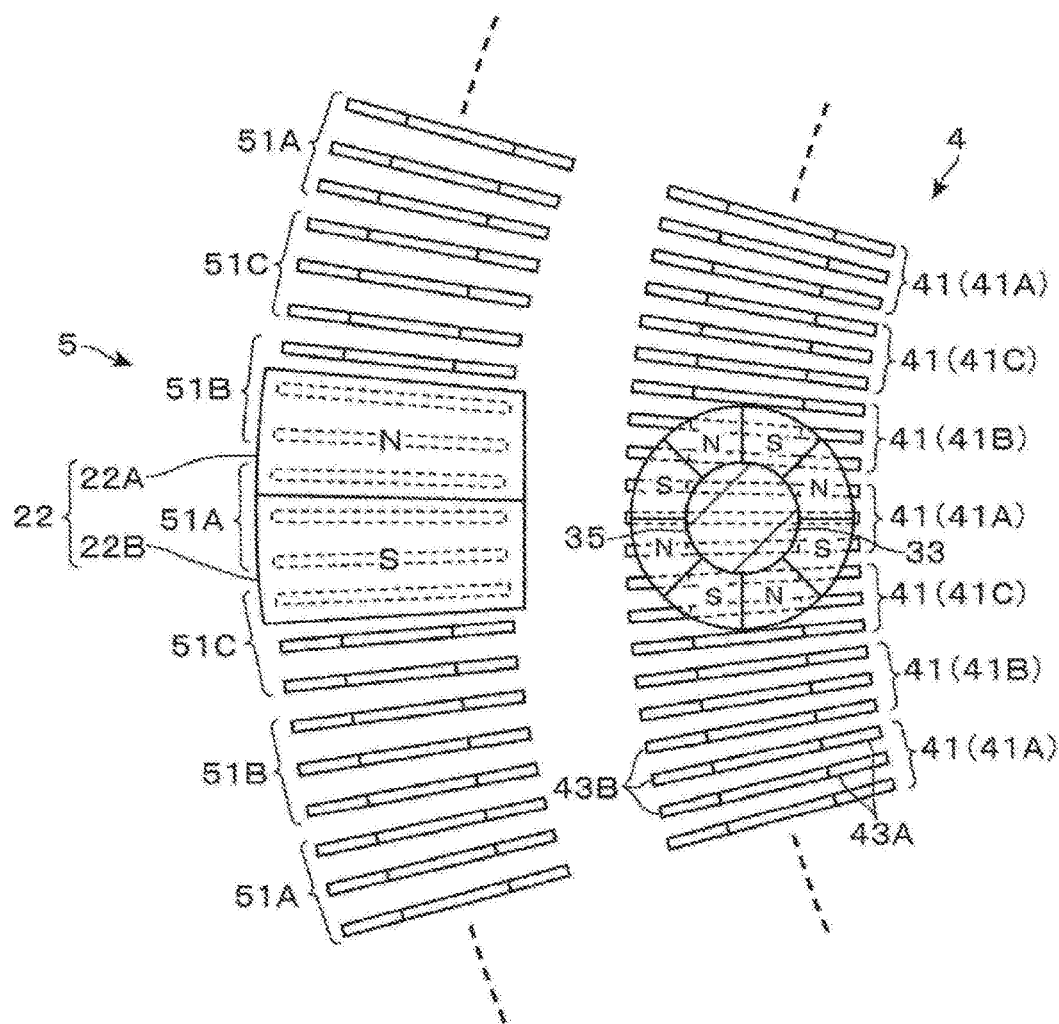
FIG. 6 is a top view of plates which constitute the drive unit for revolution and the drive unit for rotation.
Figure 7:
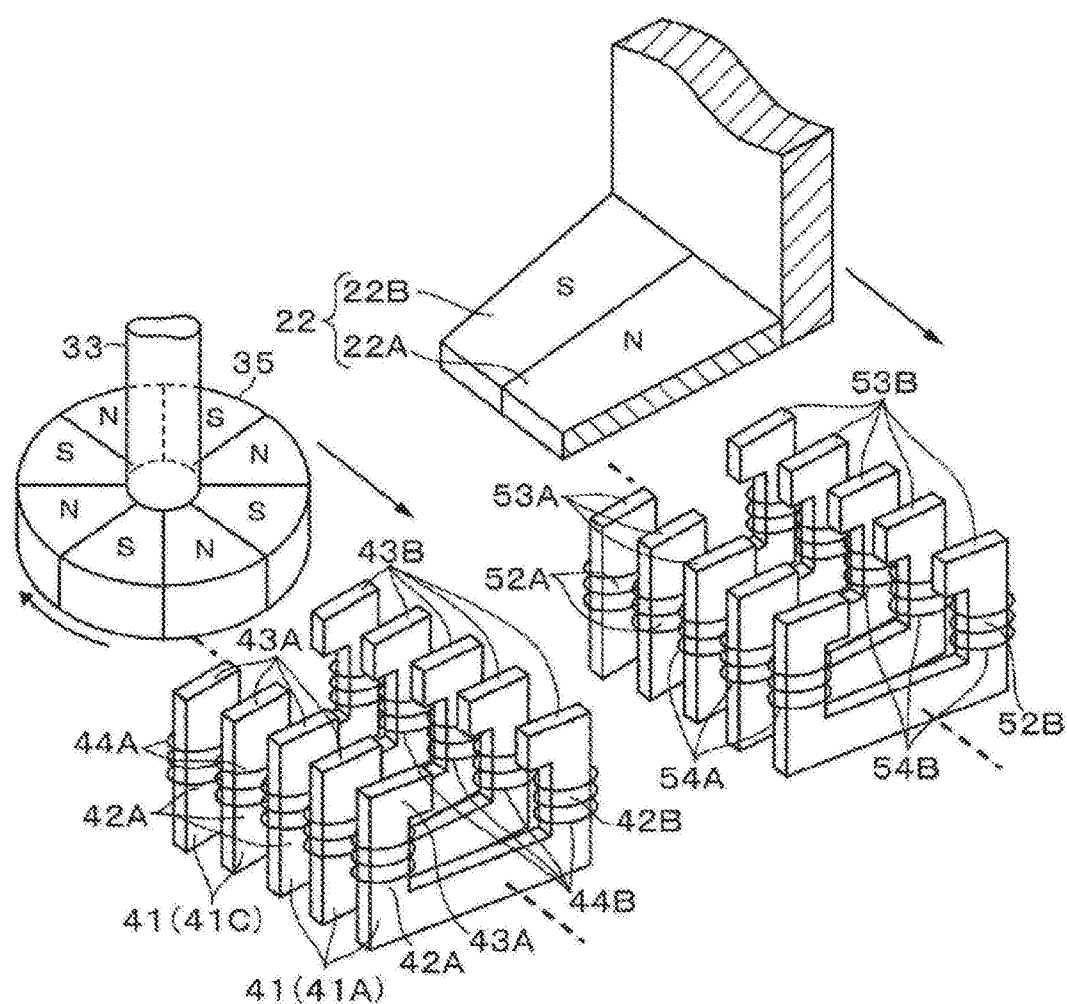
FIG. 7 is a perspective view of the plates.

Next, a drive unit for rotation 4 and the drive unit for revolution 5 will be described. FIGS. 5 and 6 are plan views of the drive unit for rotation 4 and the drive unit for revolution 5, and FIG. 7 is a perspective view of the drive unit for rotation 4 and the drive unit for revolution 5. In FIG. 5, a symbol "P1" indicates a rotational central axis of the rotary table 3 and the ring plate 21. When the rotary table 3 and the ring plate 21 rotate, the magnetic gears 35 circulates and revolves around the central axis P1. In this circulating track, the magnetic gears 35 are arranged at regular intervals. The drive unit for rotation 4 used as a rotating mechanism includes, for example, 240 upwardly-extended plates 41. Each of the upwardly-extended plates 41 is arranged within the recess 26, that is to say, under the circulating track of the magnetic gears 35, along the circulating track. In addition, each of the upwardly-extended plates 41 is installed such that the longitudinal direction thereof corresponds to the diameter of the rotary table 3.

The upwardly-extended plate 41 is formed in a substantially concave shape when viewed front the lateral side. Thus, each of the upwardly-extended plates 41 includes two vertical plates 42A and 42B. The vertical plate 42A is disposed close to the central axis P1, and the vertical plate 42B is disposed far from the central axis P1. The vertical plates 42A and 42B are configured as individual electromagnets, respectively. Upper portions of the vertical plate 42A and 42B is configured as magnetic poles 43A and 43B of the electromagnet, respectively. The magnetic poles 43A and 43B are respectively formed to slightly extend horizontally from the vertical plates 42A and 42B toward the center of the upwardly-extended plate 41 in the longitudinal direction thereof. In the upwardly-extended plates 41, the magnetic poles 43A constitute an inner magnetic pole group, and the magnetic poles 43B constitute an outer magnetic pole group.

Coils 44A and 44B are wound around the vertical plates 42A and 42B, respectively. As will be described below, current is supplied to the coils 44A and 44B such that the polarities of the magnetic poles 43A and 43B are respectively switched with time. Thus, each of the magnetic gears 35 is configured to rotate around the central axis thereof in the circumferential direction. With the rotation of the magnetic gear 35, the wafer holder 32 connected to the magnetic gear 35 is rotated so that the wafer W mounted on the wafer holder 32 is horizontally rotated around the center thereof. In some cases, the rotation of the wafer W and the magnetic gears 35 may be referred to as "rotation" to distinguish the aforementioned revolution.

Figure 8:
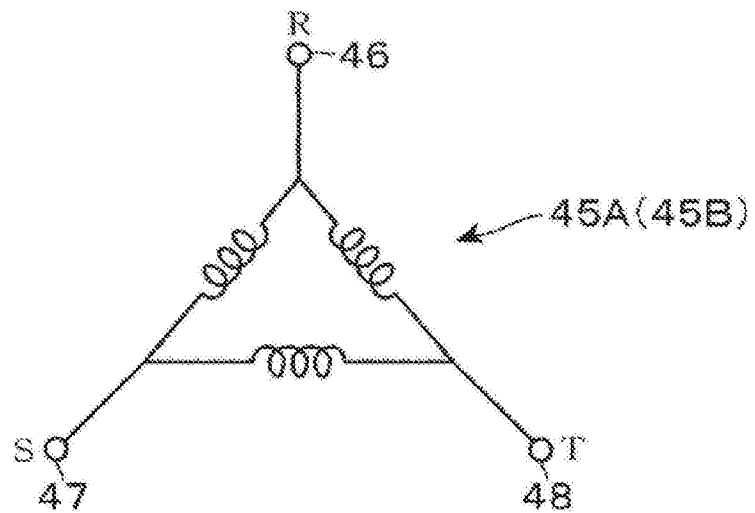
FIG. 8 is a circuit view of a power source which constitutes the drive units.

The drive unit for rotation 4 includes power source units (power supplies) 45A and 45B. Each of the coils 44A is supplied with current from the power source unit 45A, and each of the coils 44B is supplied with current from the power unit 45B. The power source units 45A and 45B are similar to each other in configuration, and therefore, the power source unit 45A will be described by way of representative example. The power source unit 45A is a three-phase alternating current power source, and has a circuit configuration such as a so-called Δ-connection as illustrated in FIG. 8. Thus, the power source unit 45A can supply currents having phases shifted by 120 degrees with respect to each other. The phases of the currents will be referred to as an R phase, an S phase, and a T phase, respectively. In addition, in FIG. 8, terminals through which the currents of respective phases from the Δ-connection are outputted are indicated by reference numerals 46, 47, and 48, respectively.

Figure 9:
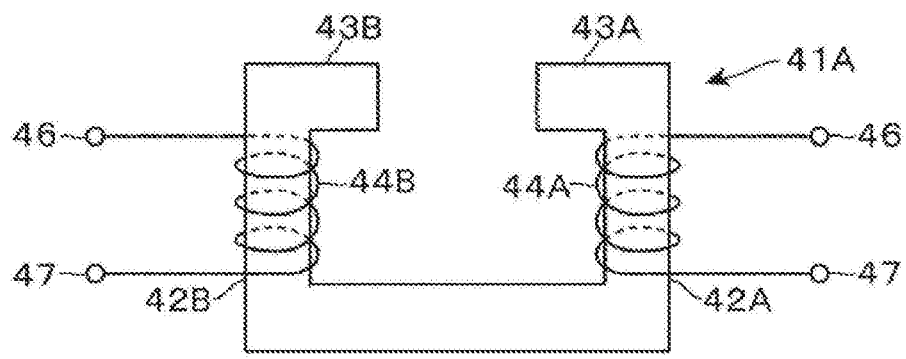
FIGS. 9 to 11 are explanatory views illustrating connective relationships of the power source and coils wound around the plate.
Figure 10:
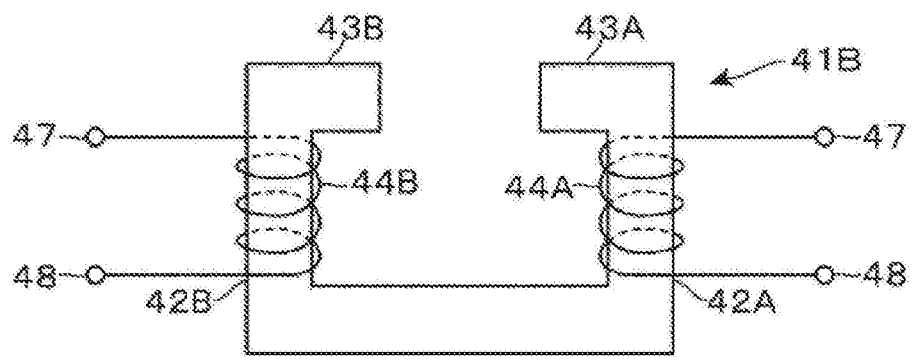
Figure 11:
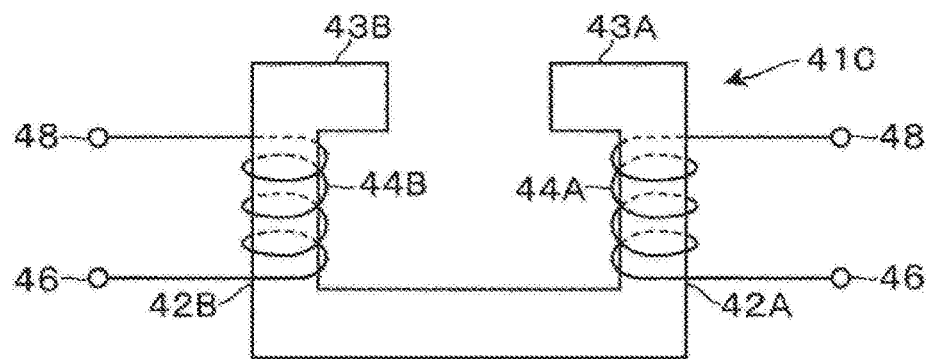
Figure 12:
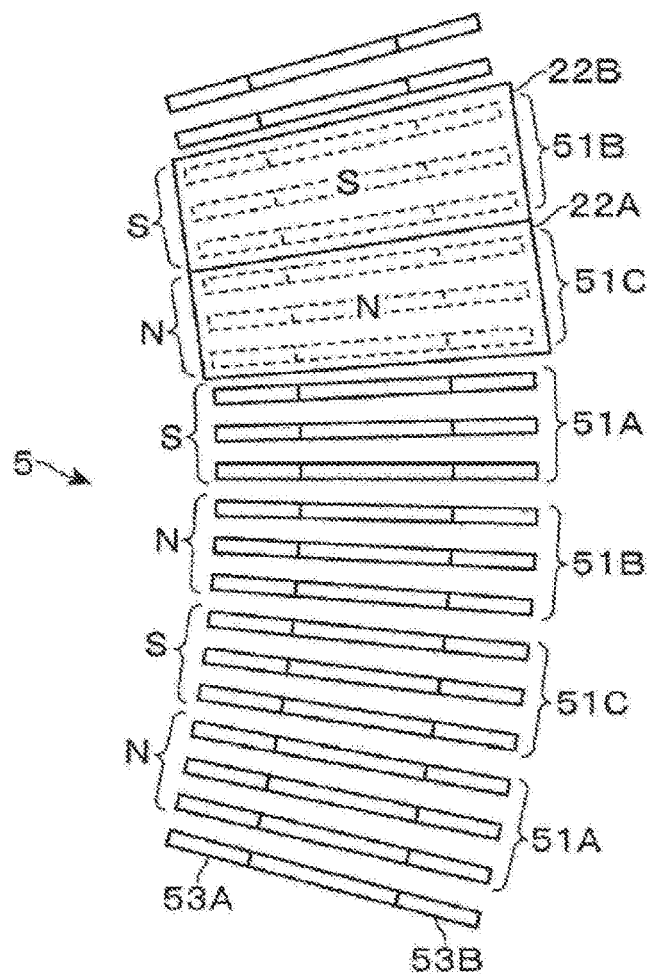
FIGS. 12 to 15 are explanatory views illustrating a state in which magnetic poles installed in the ring plate move forward.

FIGS. 9 to 11 illustrate a connection relationship between the coils 44A and 44B of each of the upwardly-extended plates 41 and the terminals 46 to 48 of the power source units 45A and 45B, respectively. The coils 44A and 44B of each of the upwardly-extended plates 41 are respectively connected to the power source units 45A and 45B as illustrated in any one of FIGS. 9 to 11. As illustrated in each of FIGS. 9 to 11, the upwardly-extended plate 41 to which the coils 44A and 44B are connected, may be sometimes indicated by 41A, 41B, and 41C. Both ends of the coil 44A of the upwardly-extended plate 41A of FIG. 9 are connected to the terminals 46 and 47 of the power source unit 45A. Both ends of the coil 44B of the upwardly-extended plate 41A are connected to the terminals 46 and 47 of the power source unit 45B. In this way, the current of the R phase is supplied to the coils 44A and 44B of the upwardly-extended plate 41A.

Both ends of the coil 44A of the upwardly-extended plate 41B of FIG. 10 are connected to the terminals 47 and 48 of the power source unit 45A. Both ends of the coil 44B of the upwardly-extended plate 41B are connected to the terminals 47 and 48 of the power source unit 45B. In this way, the current of the S phase is supplied to the coils 44A and 44B of the upwardly-extended plate 41B. Both ends of the coil 44A of the upwardly-extended plate 41C of FIG. 11 are connected to the terminals 48 and 46 of the power source unit 45A. Both ends of the coil 44B of the upwardly-extended plate 41C are connected to the terminals 48 and 46 of the power source unit 45B. In this way, the current of the T phase is supplied to the coils 44A and 44B of the upwardly-extended plate 41C. Thus, the alternating currents are supplied to the coils 44A and coils 44B of each of the upwardly-extended plates 41A to 41C, respectively, so that the polarity of each of the magnetic poles 43A and 43B is switched between the S-pole and the N-pole. In this embodiment, when viewed in the arrangement direction of the upwardly-extended plates 41, three upwardly-extended plates 41A, three upwardly-extended plates 41B, and three upwardly-extended plates 41C are repeatedly arranged in this order.

The drive unit for revolution 5 used as a rotating mechanism is configured similar to the drive unit for rotation 4 except for the positions where the plates are disposed. For the sake of simplicity, plates corresponding to the plates 41A, 41B, and 41C are indicated by 51A, 51B, and 51C, respectively. Accordingly, the coils 44A and 44B of each of the plates 51A, 51B, and 51C are supplied with the R phase-current, the S phase-current, and T phase-current, respectively. The plates 51A to 51C are arranged within the recess 27 in a mutually spaced-apart relationship along the circumferential direction of the recess 27 such that longitudinal directions of the plates 51A to 51C correspond to the diametric direction of the rotary table 3. For example, three plates 51B, three plates 51C, and three plates 51A are repeatedly arranged in this order. In addition, although in FIG. 5, only some of a group of plates 51 are illustrated, plural ones of the group of the plates 51 groups may be arranged around the central axis P1 like a group of the upwardly-extended plates 41. In the drawings, vertical plates which correspond to the vertical plates 42A and 42B of the upwardly-extended plates 41, are indicated by 52A and 52B.

Magnetic poles of the plates 51, which correspond to the magnetic poles 43A and 43B, are indicated by 53A and 53B. Coils which correspond to the coils 44A and 44B are indicated by 54A and 54B. In addition, power source units which correspond to the power source units 45A and 459 are indicated by 55A and 55B (see FIG. 1). The plates 41 of the drive unit for rotation 4 and the plates 51 of the drive unit for revolution 5 are not rotated with the rotation of the rotary table 3 and the ring plate 21. That is to say, the plates 41 and 51 are installed independently of the rotary table 3 and the ring plate 21.

Configurations of respective parts other than the drive unit for rotation 4 and the drive unit for revolution 5 will be described with reference to FIGS. 1 to 3. A transfer port 11A through which the wafer W is transferred, and a gate valve 11B configured to open/close the transfer port 11A are installed in the sidewall of the container body 13 (see FIG. 2). The wafer W is delivered between a transfer mechanism entering into the vacuum container 11 through the transfer port 11A and the respective recess 32A. Specifically, through-holes are formed at corresponding positions in the bottom surface of the recess 32A, the bottom portion of the container body 13 and the rotary table 3, respectively. Leading ends of pins are configured to be moved up and down between above the recesses 32A and below the container body 13 through the respective through-holes. Through the pins, the wafer W is delivered. These pins and the through-holes through which the pins pass in the respective parts, are omitted.

In addition, as illustrated in FIG. 2, a raw material gas nozzle 61, a separation gas nozzle 62, an oxidizing gas nozzle 63, a plasma generation gas nozzle 64, and a separation gas nozzle 65 are sequentially arranged above the rotary table 3 in a mutually spaced-apart relationship along the rotational direction of the rotary table 3. Each of the gas nozzles 61 to 65 is formed in a rod shape that horizontally extends along the diameter of the rotary table 3 from the sidewall of the vacuum container 11 toward the central portion thereof. Each of the gas nozzles 61 to 65 discharges gas downward through a plurality of discharge holes 66 formed along the diametric direction of the respective nozzles.

The raw material gas nozzle 61 as a processing gas supply mechanism discharges a BTBAS (bis-tertiary-butyl-aminosilane) gas. In the drawing, reference numeral "67" indicates a nozzle cover that covers the raw material gas nozzle 61. The nozzle cover 67 is formed in a fan shape gradually spreading from the raw material gas nozzle 61 toward each of upstream and downstream sides in the rotational direction of the rotary table 3. The nozzle cover 67 is to increase a concentration of the BTBAS gas below the nozzle cover 67 and to improve adsorption of the BTBAS gas onto the wafer W. In addition, the oxidizing gas nozzle 63 discharges the ozone gas. The separation gas nozzles 62 and 65, which are gas nozzles for discharging the $N_2$ gas, are arranged to divide the fan-shaped protrusions 28 of the ceiling plate 12 in the circumferential direction, respectively.

The plasma generation gas nozzle 64 discharges a plasma generation gas as a mixture gas of, for example, an argon (Ar) gas and an oxygen ($O_2$) gas. A fan-shaped opening opened along the rotational direction of the rotary table 3 is formed in the ceiling plate 12. A cup-shaped plasma forming part 71 formed of a dielectric material such as quartz is installed in a shape corresponding to the opening to block the opening. The plasma forming part 71 is installed between the oxidizing gas nozzle 63 and the protrusion 28 when viewed in the rotational direction of the rotary table 3. In FIG. 2, a position where the plasma forming part 71 is installed is indicated by a dashed dotted line.

As illustrated in FIG. 1, a protrusion 72 is formed along a periphery of the plasma forming part 71 in a bottom surface of the plasma forming part 71. A leading end of the plasma generation gas nozzle 64 penetrates the protrusion 72 from the outer circumference side of the rotary table 3 such that the plasma generation gas can be discharged to a region enclosed by the protrusion 72. The protrusion 72 has a function of suppressing the $N_2$ gas, the ozone gas, and the BTBAS gas from flowing below the plasma forming part 71, thereby suppressing a decrease in concentration of the plasma generation gas.

A box-shaped Faraday shield 73 which is opened upward, is disposed in a recess formed on the plasma forming part 71. On a bottom surface of the Faraday shield 73, an antenna 75 formed by winding an metal wire in a coil shape around a vertical axis is installed with an insulating plate member 74 interposed between the bottom surface and the antenna 75. A high frequency power source 76 is connected to the antenna 75. A plurality of slits 77 is formed in the bottom surface of the Faraday shield 73. The slits 77 are to suppress electric field components from being directed downward, and magnetic field components from being directed downward, among electromagnetic fields generated from the antenna 75 when applying high frequency waves to the antenna 75. Each of the plurality of slits 77 is formed to extend in a direction orthogonal to (intersecting with) the winding direction of the antenna 75. The plurality of slits 77 is arranged along the winding direction of the antenna 75. The aforementioned respective parts are configured in this way. Thus, when the high frequency power source 76 is turned on to apply the high frequency waves to the antenna 75, it is possible to plasmarize the plasma generation gas supplied below the plasma forming part 71.

As illustrated in FIG. 2, above the rotary table 3, a region below the nozzle cover 76 of the raw material gas nozzle 61 is defined as an adsorption region R1 where the BTBAS gas as the raw material gas is adsorbed, and a region below the oxidizing gas nozzle 63 is defined as an oxidization region R2 where the BTBAS gas is oxidized by the ozone gas. In addition, a region below the plasma forming part 71 is defined as a plasma formation region R3 where an $SiO_2$ film is modified by the plasma. Regions below the protrusions 28 are defined as separation regions D where the adsorption region R1 and the oxidization region R2 are respectively separated from each other by the $N_2$ gas discharged from the separation gas nozzles 62 and 65, thereby preventing the raw material gas and the oxidizing gas from being mixed with each other.

The exhaust port 39 is formed outward of a portion between the adsorption region R1 and the separation region D adjacent to the downstream side of the adsorption region R1 in the rotational direction such that a surplus of the BTBAS gas is exhausted. The exhaust port 38 is formed outward of the boundary between the plasma formation region R3 and the separation region D adjacent to the downstream side of the plasma formation region R3 in the rotational direction such that a surplus of the $O_3$ gas and plasma generation gas is exhausted. Further, the $N_2$ gas supplied from each of the separation regions D and the central region formation portion C of the rotary table 3 is also exhausted through each of the exhaust ports 38 and 39.

The film formation apparatus 1 includes a control part 100 which is provided with a computer for controlling the entire operation of the film formation apparatus 1 (see FIG. 1). The control part 100 stores a program that executes a film formation process to be described below. The program sends a control signal to respective parts of the film formation apparatus 1 to control the operations of the respective parts. Specifically, a supply flow rate of each gas from each of the gas nozzles 61 to 65, a temperature of the wafer W heated by the heaters 16 and 19, a supply flow rate of the $N_2$ gas into the central region formation portion C, a rotation speed (rotational speed) of the rotary table 3 caused by the drive unit for revolution 5, a rotation speed (rotation speed) of the wafer holder 32 caused by the drive unit for rotation 4 and the like are controlled by the control signal. A group of instructions for allowing respective processes (to be described below) to be executed by performing the aforementioned control operations, is stored in the program. The program is installed into the control part 100 from a storage medium such as a hard disc, a compact disc, a magneto-optic disc, a memory card, a flexible disc or the like.

Next, an operation of the drive unit for revolution 5 will be described with reference to FIGS. 12 to 15. In the drive unit for revolution 5, the supply of the current is controlled such that polarities of the magnetic poles 53A and 53B of the same plate 51 become equal to each other. In an example of FIG. 12, the magnetic poles 53A and 53B of the plate 51A become S-poles, the magnetic poles 53A and 53B of the plate 51B become S-poles, and the magnetic poles 53A and 53B of the plate 51C become N-poles. The magnetic pole 22A as the N-pole installed in the ring plate 21 is positioned over the plates 51A and 51C, and the magnetic pole 22B as the S-pole is positioned over the plates 51C and 51B.

It is assumed that the clockwise direction is a forward direction. When viewed from each of the magnetic poles 22A and 22B, the plates 51A and 51C which have polarities opposite to those of the respective magnetic poles 22A and 22B, are positioned just in front of the magnetic poles 22A and 22B, respectively. Thus, these magnetic poles 22A and 22B are respectively attracted toward the plates 51A and 51C by a magnetic force. In addition, when viewed from each of the magnetic poles 22A and 22B, the plates 51C and 51B which have the same polarities as those of the respective magnetic poles 22A and 22B, are positioned immediately in back of the magnetic poles 22A and 22B, respectively. Thus, these magnetic poles 22A and 22B respectively repel the plates 51C and 51B by a magnetic force. Such attraction and repulsion forces move the magnetic poles 22A and 22B forward. That is to say, the ring plate 21 and the rotary table 3 are rotated in the clockwise direction such that the magnetic gears 35 and the wafers W mounted on the rotary table 3 revolve.

Figure 13:
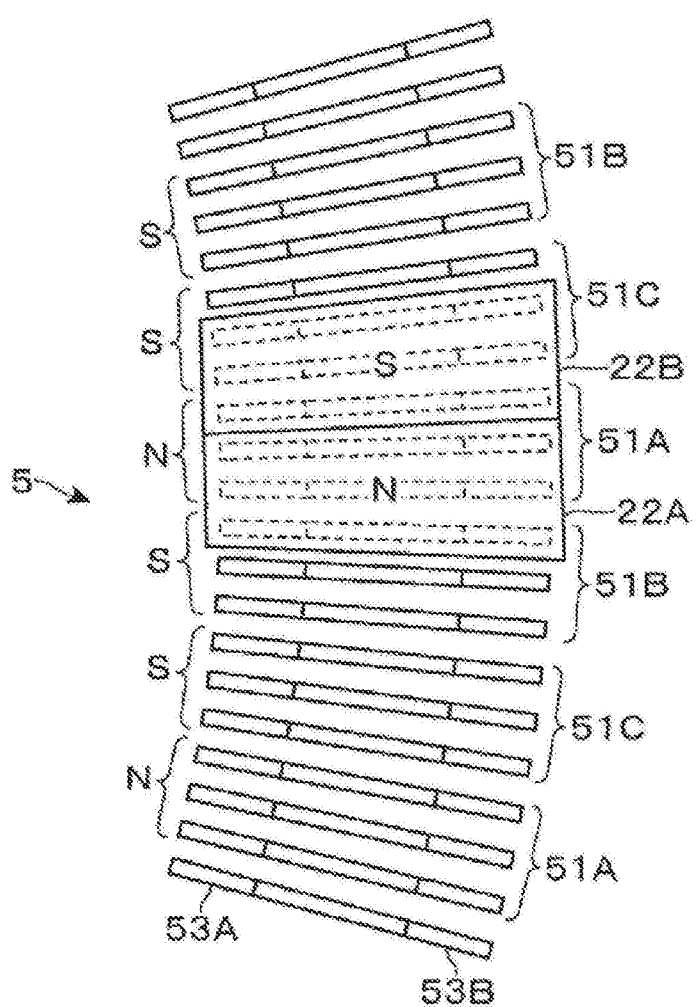

In addition, the magnetic pole 22A is positioned on the plates 51B and 51A, and the magnetic pole 22B is positioned on the plates 51A and 51C. Further, the magnetic poles 53A and 53B of the plate 51A are switched from an S-pole to an N-pole, and the magnetic poles 53A and 53B of the plate 51B are switched from an N-pole to an S-pole (FIG. 13). When viewed from each of the magnetic pole 22A and the magnetic pole 22B, the plates 51B and 51A which have polarities opposite to those of the respective magnetic poles 22A and 22B, are positioned just in front of the magnetic poles 22A and 22B, respectively. Thus, these magnetic poles 22A and 22B are respectively attracted toward the plates 51B and 51A by a magnetic force. In addition, when viewed from each of the magnetic poles 22A and 22B, the plates 51C and 51B which have the same polarities as those of the respective magnetic poles 22A and 22B, are positioned immediately in back of the magnetic poles 22A and 22B, respectively. Thus, the magnetic poles 22A and 22B respectively repel the plates 51C and 51B by a magnetic force.

Such attraction and repulsion forces further move the magnetic poles 22A and 22b forward such that the magnetic gears 35 and the wafers W continue to revolve.

Figure 14:
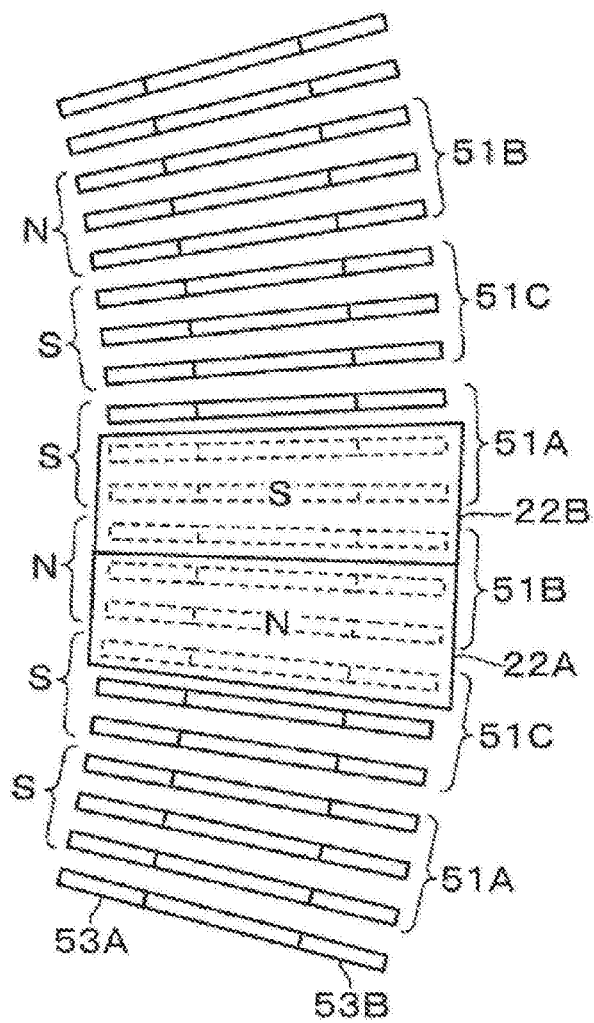

Subsequently, the magnetic pole 22A is positioned on the plates 51C and 51B, and the magnetic pole 22B is positioned on the plates 51B and 51A. Further, the magnetic poles 53A and 53B of the plate 51A are switched from an N-pole to an S-pole, and the magnetic poles 53A and 53B of the plates 51B are switched from an S-pole to an N-pole (FIG. 14). When viewed from each of the magnetic pole 22A and the magnetic pole 22B, the plates 51C and 51B which have polarities opposite to those of the respective magnetic poles 22A and 22B, are positioned just in front of the magnetic poles 22A and 22B, respectively. Thus, the magnetic poles 22A and 22B are respectively attracted toward the plates 51C and 51B by a magnetic force. In addition, when viewed from each of the magnetic poles 22A and 22B, the plates 51B and 51A which have the same polarities as those of the respective magnetic poles 22A and 22B, are positioned immediately in back of the magnetic poles 22A and 22B, respectively. Thus, the magnetic poles 22A and 22B respectively repel the plates 51B and 51A by a magnetic force. Such attraction and repulsion forces further move the magnetic poles 22A and 22b forward such that the magnetic gears 35 and the wafers W continue to revolve.

Figure 15:
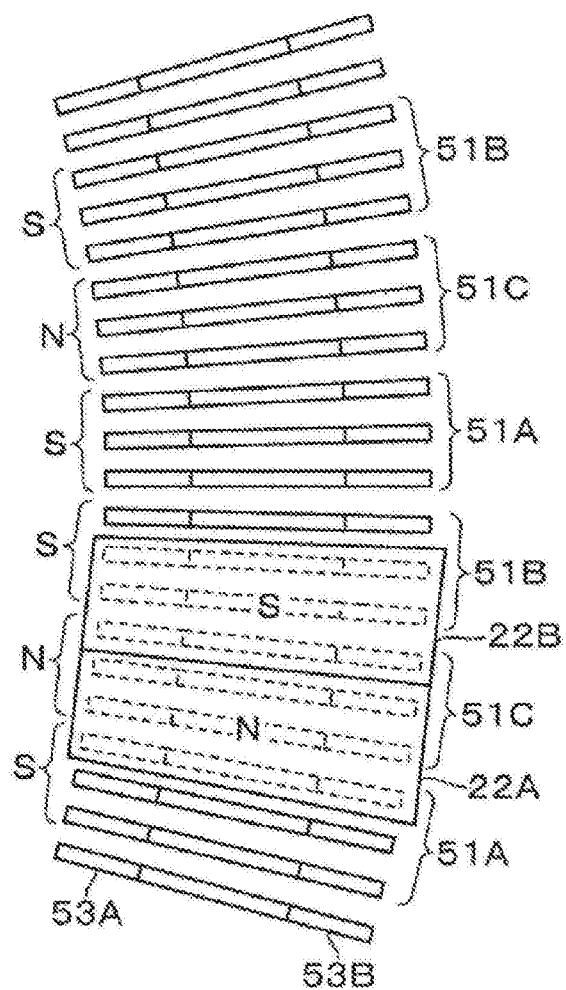

Thereafter, the magnetic pole 22A is positioned on the plates 51C and 51B, and the magnetic pole 22B is positioned on the plates 51B and 51A. Further, the magnetic poles 53A and 53B of the plate 51B are switched from an N-pole to an S-pole, and the magnetic poles 53A and 53B of the plate 51C are switched from an N-pole to an S-pole (FIG. 15). When viewed from each of the magnetic pole 22A and the magnetic pole 22B, the plates 51A and 51C which have polarities opposite to those of the respective magnetic poles 22A and 22B, are positioned just in front of the magnetic poles 22A and 22B, respectively. Thus, the magnetic poles 22A and 22B are respectively attracted toward the plates 51A and 51C by a magnetic force. In addition, when viewed from each of the magnetic poles 22A and 22B, the plates 51C and 51B which have the same polarities as those of the respective magnetic poles 22A and 22B, are positioned immediately in back of the magnetic poles 22A and 22B, respectively. Thus, the magnetic poles 22A and 22B respectively repel the plates 51C and 51B by a magnetic force. Such attraction and repulsion forces further move the magnetic poles 22A and 22B forward.

Subsequently, the polarities of the magnetic poles 53A and 53B of each of the plates 51A to 51C are switched similar to the above so that the ring plate 21 and the rotary table 3 continue to rotate by virtue of the magnetic force between the magnetic poles 53A and 53B of each of the plates 51A to 51C and the magnetic poles 22A and 22B. Thereafter, the supply of the current to the coils 54A and 54B of each of the plates 51A to 51C is stopped so that the rotation of the ring plate 21 and the rotary table 3 is stopped. The rotational speed of the ring plate 21 and the rotary table 3 can be adjusted to an arbitrary level by adjusting a cycle of the current supplied to the coils 54A and 54B.

Figure 16:
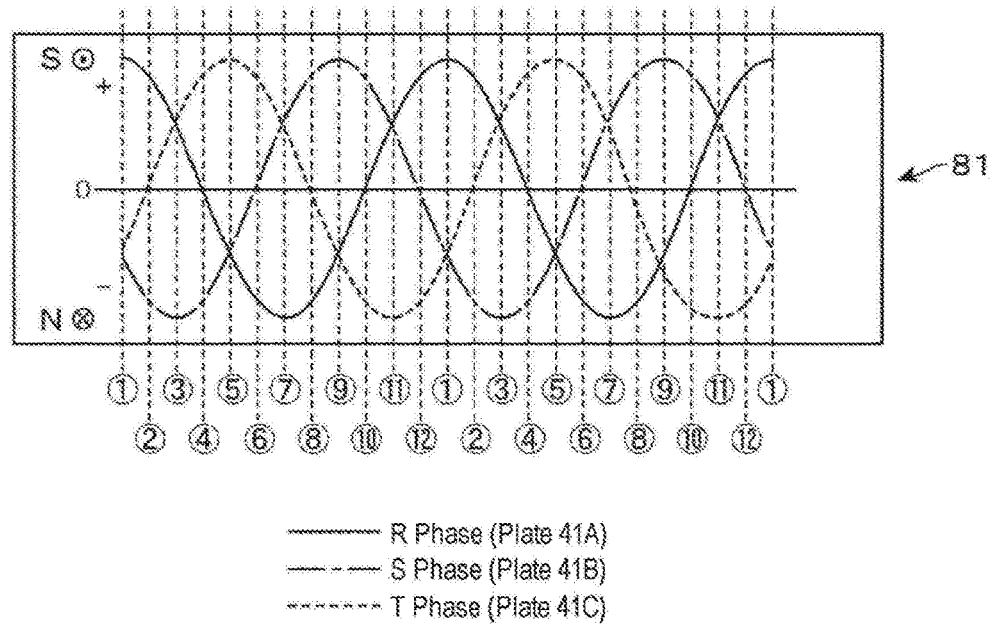
FIGS. 16 and 17 are graphs representing a relationship between three-phase alternating currents and a variation in the magnetic poles of the plate.
Figure 17:
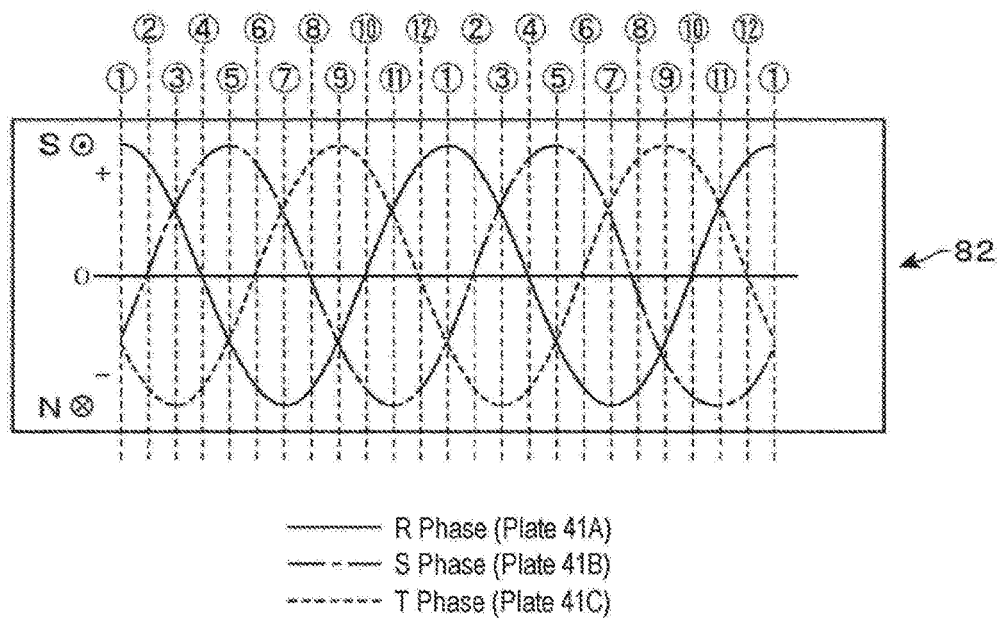

Next, the supply of the current to the plates 41 to 41C and the operation of the magnetic gear 35 will be described with reference to FIGS. 16 to 20. Graphs 81 and 82 illustrated in FIGS. 16 and 17 represent waveforms of R-phase, S-phase, and T-phase currents that are supplied to each of the coils 44A and 44B of the plates 41A to 41C. More specifically, the graph 81 represents currents of respective phases that are supplied to the coil 44A of each of the magnetic plates 41A to 41C. The graph 82 represents currents of respective phases that are supplied to the coil 44B of each of the plates 41A to 41C. In the graphs 81 and 82, the R-phase current is indicated by a solid line, the S-phase current is indicated by a dotted line, and the T-phase current is indicated by a dashed dotted line.

The horizontal axis of each of the graphs 81 and 82 represents time, and the vertical axis of each of the graphs 81 and 82 represents the magnitude and the polarity of a current. With a variation in the current, the N-pole and the S-pole of the magnetic poles 43A and 43B of the upwardly-extended plates 41A to 45C are switched. In this example, when the polarity of the current is positive (+), the magnetic poles 43A and 43B are switched to the S-pole, and when the polarity of the current is negative (−), the magnetic poles 43A and 43B are switched to the N-pole. For the sake of convenience in illustration and description, the horizontal axis of each of the graphs 81 and 82 is graduated by predetermined time increments with dotted lines. For one cycle, reference numerals 1 to 12 are numbered as circled numbers from the left side toward the right side in the horizontal axis. In the following description of the operation of the magnetic gear 35, respective times in the graphs are sometimes indicated by the circled numbers.

(When the Magnetic Gear 35 Rotates without Revolution)

Figure 18:
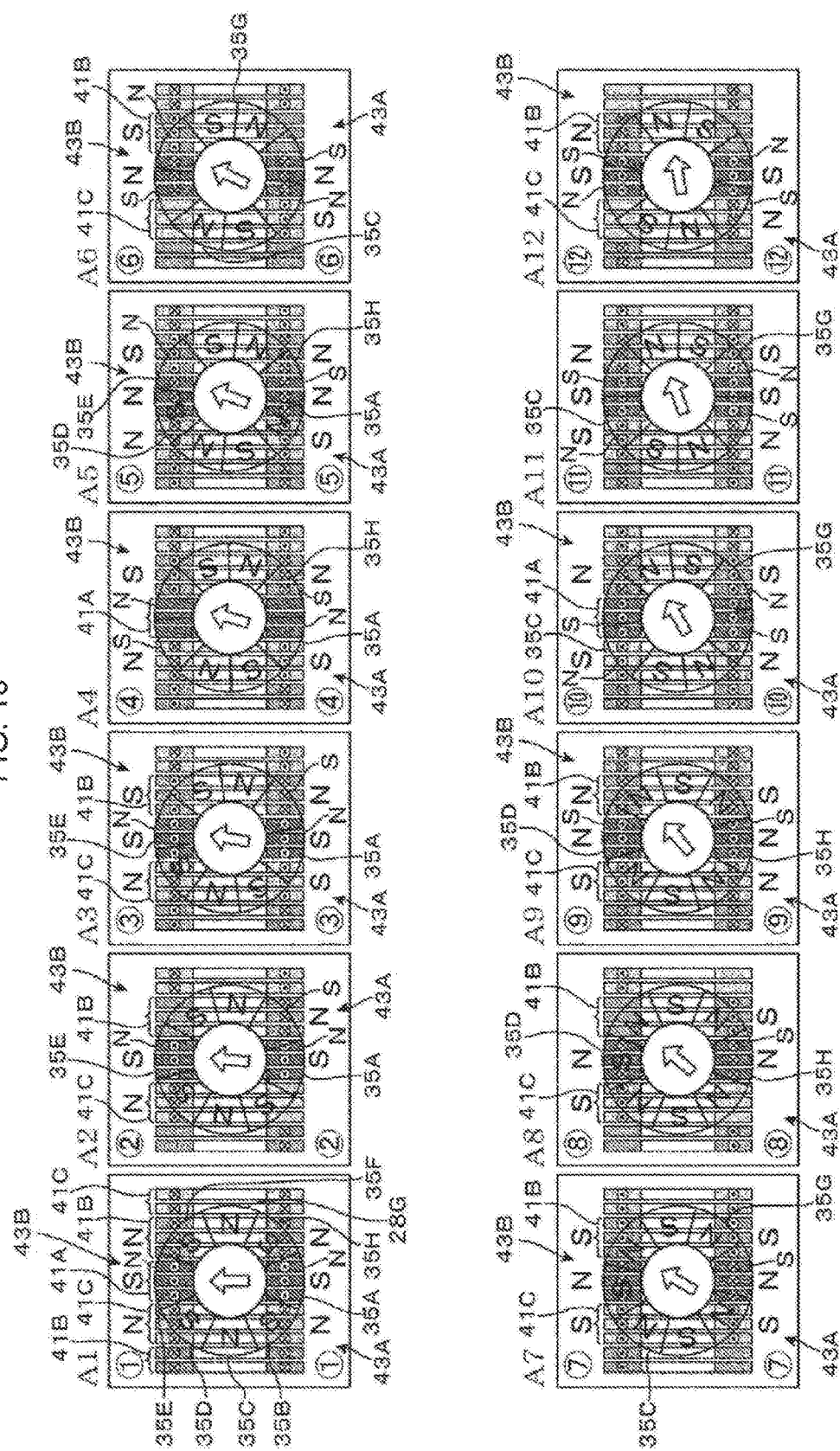
FIGS. 18 to 20 are views illustrating an operation of the magnetic gear.

FIG. 18 illustrates the operations of the magnetic gear 35 when the magnetic gear 35 rotates without revolution, with states of the magnetic gear 35 corresponding to the graphs 81 and 82. In FIG. 18, the magnetic gear 35 and the plates 41A to 41C positioned below the magnetic gear 35 are illustrated within each of columns A1 to A12. For the columns A1 to A12, a larger number following the letter "A" indicates a later state in time. In addition, the number indicated as a circled number at the magnetic pole 43A side in each column corresponds to the number of the respective time in the graph 81, and a current of each phase is supplied as indicated by the number of the time. In addition, the number indicated as a circled number at the magnetic pole 43B side in each column corresponds to the number of the respective time in the graph 82, and a current of each phase is supplied as indicated by the number of the time. In addition, by indicating a symbol ○ or X within a virtual circle indicated on the magnetic poles 43A and 43B, the polarity of each of the magnetic poles 43A and 43B are expressed as an S-pole or an N-pole.

Further, for the sake of convenience in description, magnetic poles of the magnetic gear 35 within each column are sequentially indicated by reference numerals 35A to 35H along the circumferential direction. Each of the magnetic poles 35A, 35C, 35E, and 35G is an N-pole, and each of the magnetic poles 35B, 35D, 35F, and 35H is an S-pole. Further, in each column, an arrow oriented to the magnetic pole 35E is indicated at the center of the magnetic gear 35 to represent directionality of the magnetic gear 35. In addition, for the sake of avoiding complexity of drawings, the plates 41 are illustrated in a line.

In the state where the rotation of the rotary table 3 is stopped, the current of each phase is changed as it goes to the right side in the horizontal axis of each of the graphs 81 and 82. A cycle of the current supplied to the coil 44A and a cycle of the current supplied to the coil 44B are controlled to be equivalent to each other. In the column A1 of FIG. 18, the magnetic poles 43A and 43B are in a state indicated by time ① in each of the graphs 81 and 82. In other words, the R-phase current has the maximum value of the positive level, and the S-phase current and the T-phase current have the same value of the negative level. Accordingly, the magnetic poles 43A and 43B of the plate 41A become the S-pole, and the magnetic poles 43A and 43B of the plate 41B and the magnetic poles 43A and 43B of the plate 41C become the N-pole.

In addition, by being attracted by magnetic forces caused by a group of the magnetic poles 43A and a group of the magnetic poles 43B, the magnetic poles 35B, 35A, 35H, 35D, 35E, and 35F of the magnetic gear 35 are positioned on the magnetic pole 43A of the plate 41C, the magnetic pole 43A of the plate 41A, the magnetic pole 43A of the plate 41B, the magnetic pole 43B of the plate 41C, the magnetic pole 43B of the plate 41A, and the magnetic pole 43B of the plate 41B, respectively.

From the state indicated by the column A1, for the group of the magnetic pole 43A, the R-phase and T-phase currents are decreased and the S-phase current is increased. For the group of the magnetic pole 43B, the R-phase and T-phase currents are decreased and the S-phase current is increased. Thus, the magnetic poles 43A of the plates 41C and the magnetic poles 43B of the plates 41B are brought into a non-polar state (column A2, time ② of the graphs 81 and 82), and then become an S-pole. Thus, the magnetic pole 35E as the N-pole of the magnetic gear 35 is attracted toward the magnetic pole 43B of the plate 41B, the magnetic pole 35A as the N-pole of the magnetic gear 35 is attracted toward the magnetic pole 43A of the plate 41C, so that the magnetic gear 35 is rotated clockwise when viewed from the top (column A3, time ③ of graphs 81 and 82).

Thereafter, for the group of the magnetic poles 43A, the R-phase current continues to be decreased, the S-phase current is increased from the minimum value, and the T-phase current continues to be increased. For the group of the magnetic poles 43B, the R-phase current continues to be decreased, the S-phase current continues to be increased, and the T-phase current is increased from the minimum value. Thus, the magnetic poles 43A and the magnetic poles 43B of the plate 41A are brought into a non-polar state (column A4, time ④ of the graphs 81 and 82), and then become an N-pole. Accordingly, the magnetic pole 35H as the S-pole of the magnetic gear 35 is attracted toward the magnetic pole 43A of the plate 41A, the magnetic pole 35D as the S-pole of the magnetic gear 35 is attracted toward the magnetic pole 43B of the plate 41A, so that the magnetic gear 35 is further rotated clockwise when viewed from the top (column A5, time ⑤ of the graphs 81 and 82).

Thereafter, for the group of the magnetic poles 43A, the R-phase current continues to be decreased, the S-phase current continues to be increased, and the T-phase current is decreased from the maximum value. For the group of the magnetic poles 43B, the R-phase current continues to be decreased, the S-phase current is decreased from the maximum value, and the T-phase current continues to be increased. Thus, the magnetic poles 43A of the plate 41B and the magnetic poles 43B of the plate 41C are brought into a non-polar state (column A6, time ⑥ of the graphs 81 and 82), and then become an S-pole. Accordingly, the magnetic pole 35G as the N-pole of the magnetic gear 35 is attracted toward the magnetic pole 43A of the plate 41B, the magnetic pole 35C as the N-pole of the magnetic gear 35 is attracted toward the magnetic pole 43B of the plate 41C, so that the magnetic gear 35 is further rotated clockwise when viewed from the top (column A7, time ⑦ of the graphs 81 and 82).

Subsequently, similar to the above, with the variation in the current of the three-phase alternating current, the polarities of the magnetic poles 43A and 43B of the plates 41A to 41C are changed. By virtue of magnetic forces generated by the magnetic poles 43A and 43B having the changed polarities, the magnetic poles of the magnetic gear 35 positioned in the vicinity of the magnetic poles 43A and 43B having the changed polarities are attracted such that the clockwise rotation of the magnetic gear 35 when viewed from the top is continued. The operations of the columns A8 to A12 will be described briefly. The magnetic poles 43A of the plate 41C and the magnetic poles 43B of the plate 41B are brought into a non-polar state (column A8, time ⑧ of the graphs 81 and 82). Thereafter, the magnetic poles 43A and 43B become N-poles such that the magnetic poles 35D and 35H as the S-pole of the magnetic gear 35 are attracted toward the magnetic poles 43A and 43B (column A9, time ⑨ of the graphs 81 and 82).

Subsequently, the magnetic poles 43A and the magnetic poles 43B of the plate 41A are brought into a non-polar state (column A10 time ⑩ of the graphs 81 and 82). Thereafter, the magnetic poles 43A and 43B become S-poles such that the magnetic poles 35C and 35G as the N-pole of the magnetic gear 35 are attracted toward the magnetic poles 43A and 43B (column A11, time ⑪ of the graphs 81 and 82). Thereafter, the magnetic poles 43A of the plate 41B and the magnetic poles 43B of the plate 41C are brought into a non-polar state (column A12, time ⑫ of the graphs 81 and 82). After the state of the column A12, the polarities of the group of the magnetic poles 43A and the group of the magnetic poles 43B are returned to the state indicated in column A1. Subsequently, the changes of polarities as illustrated in columns A1 to A12 are repeated. Thus, the magnetic gear 35 continues to be rotated. In addition, when the supply of power to the group of the magnetic poles 43A and the group of the magnetic poles 43B is stopped, the rotation of the magnetic gear 35 is stopped. The cycle of the current of each phase is controlled such that the rotational speed of the magnetic gear 35 as illustrated in FIG. 18 is controlled.

(When the Magnetic Gear 35 Revolves without Rotation)

Figure 19:
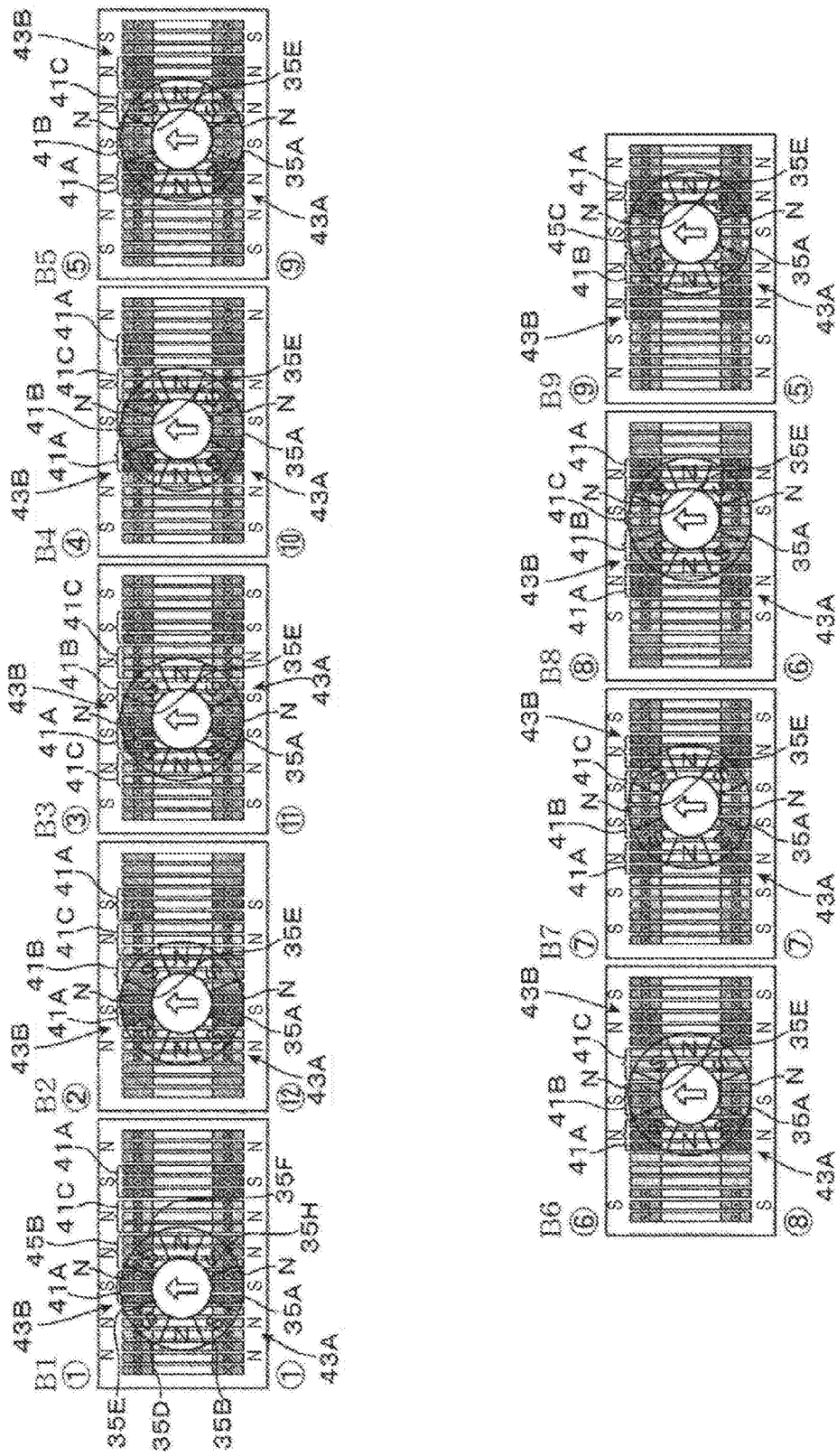

FIG. 19 represents the operations of the magnetic gear 35 when the magnetic gear 35 revolves without rotation. In FIG. 19, there are illustrated columns B1 to B9 in which the state of the magnetic gear 35 are illustrated to correspond to the graphs 81 and 82 as in FIG. 18. In this case, for the coils 44A of the plate 41, a value of each current is controlled as it goes from the left side to the right side in the horizontal axis of the graph 81. For the coils 44B of the plate 41, a value of each current is controlled as it goes from the right side to the left side in the horizontal axis of the graph 82. In addition, a cycle of the current supplied to the coils 44A and a cycle of the current supplied to the coils 44B are equal to each other.

First, in column B1, current is supplied to a group of the magnetic poles 43A and a group of the magnetic poles 43B at time ① in each of the graphs 81 and 82, as illustrated in column A1 of FIG. 18. That is to say, the magnetic poles 43A and 43B of the plate 41A become an S-pole, and the magnetic poles 43A and 43B of the plate 41B and the magnetic poles 43A and 43B of the plate 41C become an N-pole. In addition, among the magnetic poles 35A to 35H, the magnetic pole 35A is positioned closest to the central axis of the rotary table 3, and the magnetic pole 35E is positioned closest to the peripheral portion of the rotary table 3. The magnetic pole 35A and the magnetic pole 35E are positioned on the magnetic poles 43A and 43B of the plate 41A, respectively.

From the state of the column B1, the magnetic gear 35 revolves by the drive unit for rotation 4 and moves clockwise above the group of the magnetic poles 43A and the group of the magnetic poles 43B when viewed from the top. In addition, for the group of the magnetic poles 43A and the group of the magnetic pole 43B, the R-phase and T-phase currents are decreased, and the S-phase current is increased. Thus, the polarities of the magnetic poles 43A and 43B of the plate 41B below a traveling path of the magnetic poles 35A and 35E are changed from an N-pole into a non-polar state (column B2, time ⑫ of the graph 81 and time ② of graph 82). Subsequently, the polarities of the magnetic poles 43A and 43B of the plate 41B become an S-pole, and the magnetic poles 35A and 35E are positioned above the magnetic poles 43A and 43B of the plate 41B (column B3, time ⑪ of the graph 81 and time ③ of graph 82). In addition, the magnetic poles 35A and 35E are attracted to the magnetic poles 43A and 43B of which the polarities are changed in this way, so that the orientation of the magnetic gear 35 is maintained. That is to say, the rotation of the magnetic gear 35 is not caused.

Thereafter, for the group of the magnetic poles 43A and the group of the magnetic poles 43B, the R-phase current continues to be decreased, the S-phase current continues to be increased, and the T-phase current is increased from the minimum value. The polarities of the magnetic poles 43A and 43B of the plate 41A are changed from the S-pole into a non-polar state (column B4, time ⑩ of the graph 81 and time ④ of the graph 82), and then become an N-pole (column B5, time ⑨ of the graph 9 and time ⑤ of the graph 82). Thereafter, for the group of the magnetic poles 43A and the group of the magnetic poles 43B, the R-phase current continues to be decreased, the S-phase current is decreased from the maximum value, and the T-phase current continues to be increased. Thus, the polarities of the magnetic poles 43A and 43B of the plate 41C below the traveling path of the magnetic poles 35A and 35B are changed from the N-pole into a non-polar state (column B6, time ⑧ in the graph 81 and time ⑥ in graph 82). Subsequently, the polarities of the magnetic poles 43A and 43B of the plate 41C become the S-pole, and the magnetic poles 35A and 35E are positioned above the magnetic poles 43A and 43B of the plate 41A (column B7, time ⑦ of the graph 81 and time ⑦ of graph 82). In addition, the magnetic poles 35A and 35E are attracted to the magnetic poles 43A and 43B of which the polarities are changed in this way, so that the orientation of the magnetic gear 35 is maintained.

Thereafter, for the group of the magnetic poles 43A and the group of the magnetic poles 43B, the R-phase current is increased from the minimum value, the S-phase current continues to be decreased, and the T-phase current continues to be increased, so that the polarities of the magnetic poles 43A and 43B of the plate 41B are changed from the S-pole into a non-polar state (column B8, time ⑧ of graph 81 and time ⑥ of the graph 82), and subsequently, are changed to the N-pole (column B9, time ⑦ of the graph 81 and time ⑦ of graph 82).

After the state illustrated in column B9, with the change of the current supplied to the group of the magnetic poles 43A and the group of the magnetic poles 43B, the polarities of the magnetic poles 43A and 43B of the plate 41A below the traveling path of the magnetic poles 35A and 35E are changed from the N-pole into a non-polar state. When the magnetic poles 35A and 35E are positioned above the magnetic poles 43A and 43B of the plate 41A, the polarities of the magnetic poles 43A and 43B of the plate 41A become the S-pole. Thus, the orientation of the magnetic gear 35 is maintained so that the magnetic gear 35 continues to revolve without rotation. Thereafter, the rotation of the rotary table 3 is stopped and the supply of power to the group of the magnetic poles 43A and the group of the magnetic poles 43B is stopped. In this way, the revolution of the magnetic gear 35 which is not rotating, is terminated.

For the sake of convenience in description, descriptions have been made with a focus on the polarities of the magnetic poles positioned below the magnetic poles 35A and 35E in the group of the magnetic poles 43A and the group of the magnetic poles 43B. However, the current supplied to the group of the magnetic poles 43A and the group of the magnetic poles 43B during the revolution of the magnetic gear 35 is controlled. Thus, the magnetic poles 43A and 43B, which are positioned below the magnetic poles 35B and 35H as the S-poles positioned in the vicinity of the central axis of the rotary table 3 and are positioned below the magnetic poles 35D and 35F as the S-poles positioned in the vicinity of the peripheral portion of the rotary table 3, become N-poles. That is to say, the polarity of each magnetic pole is controlled such that, in the group of the magnetic poles 43A and the group of the magnetic poles 43B, the magnetic poles positioned below the magnetic poles 35A and 35E become S-poles, and the magnetic poles positioned below the magnetic poles 35B, 35H, 35D, and 35F become N-poles. Thus, the magnetic gear 35 can be continuously revolved without rotating. As described above, when the magnetic gear 35 is revolved without rotation, the cycle of the current is controlled according to the rotational speed of the magnetic gear 35.

(When the Magnetic Gear 35 Revolves while Rotating)

Figure 20:
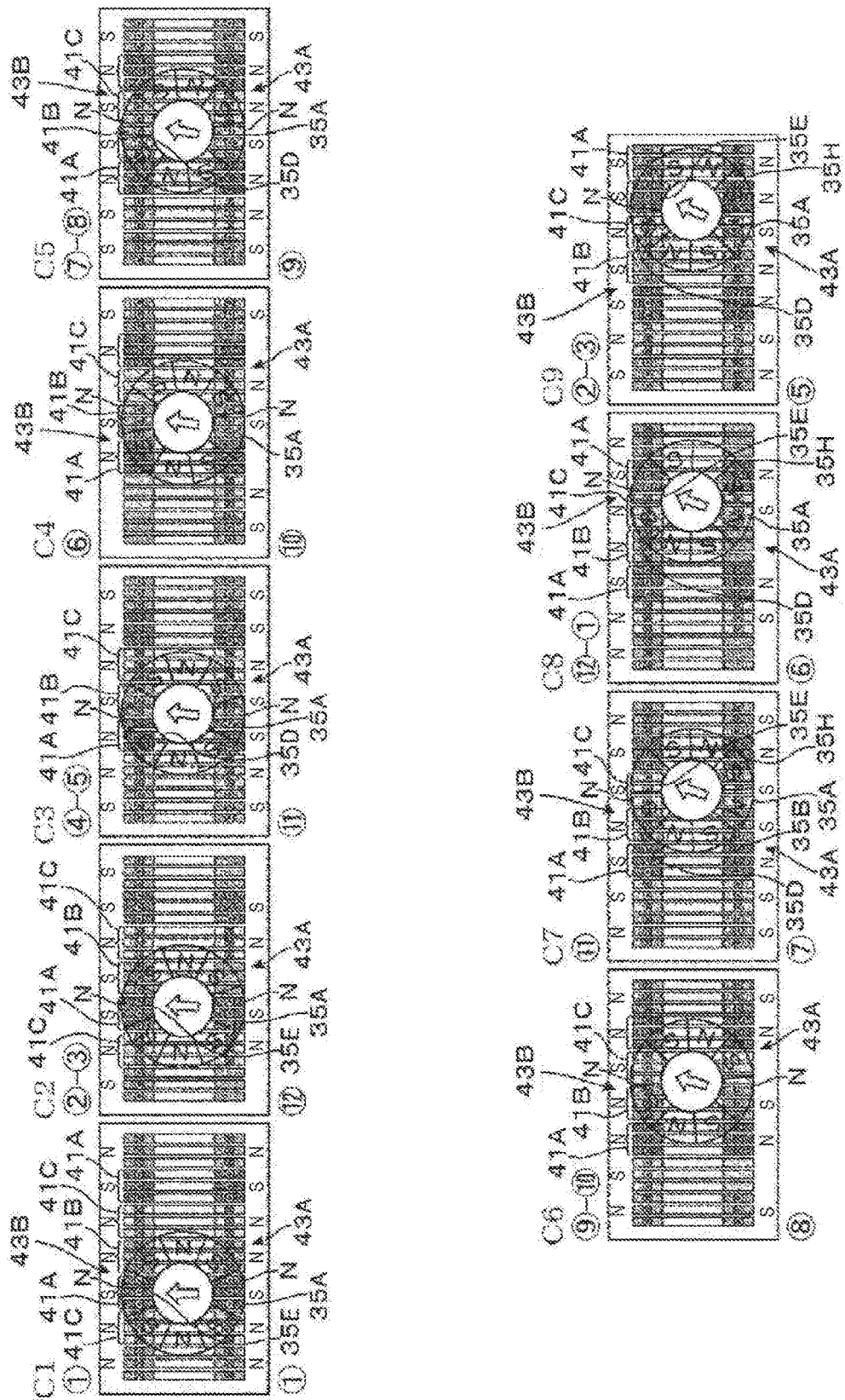

FIG. 20 represents the operations of the magnetic gear 35 when the magnetic gear 35 revolves while rotating. In FIG. 20, there are illustrated columns C1 to C9 in which the state of the magnetic gear 35 are illustrated to correspond to the graphs 81 and 82 as in FIG. 18. In this case, for the coils 44A of the plates 41, a value of each current is controlled as it goes from the left side to the right side in the horizontal axis of the graph 81. For the coils 44B of the plate 41, a value of each current is controlled as it goes from the right side to the left side in the horizontal axis of the graph 82. In addition, a cycle of the current supplied to the coils 44A and a cycle of the current supplied to the coils 44B are different from each other. The cycle of the current supplied to the coils 44B is shorter than the cycle of the current supplied to the coils 44A.

First, in the state illustrated in the column C1, a current is supplied to the group of the magnetic poles 43A and the group of the magnetic poles 43B at time ① of each of the graphs 81 and 82, as illustrated in the column A1 of FIG. 18. That is to say, the magnetic poles 43A and 43B of the plate 41A become S-poles, and the magnetic poles 43A and 43B of the plate 41B and the magnetic poles 43A and 43B of the plate 41C become N-poles. In addition, the magnetic pole 35A and the magnetic pole 35E are positioned above the magnetic poles 43A and 43B of the plate 41A, respectively.

From the state of the column C1, the magnetic gear 35 revolves and moves clockwise above the group of the magnetic poles 43A and the group of the magnetic poles 43B when viewed from the top. In addition, for the group of the magnetic poles 43A and the group of the magnetic poles 43B, the R-phase and T-phase currents are decreased, and the S-phase current is increased. Thus, the polarity of the magnetic poles 43A of the plate 41B is changed from the N-pole into a non-polar state, and the polarity of the magnetic poles 43B of the plate 41B is changed from the N-pole into a non-polar state. Thereafter, the polarity of the magnetic poles 43A and 43B is changed into the S-pole (column C2, time ⑫ of the graph 81, and time ②-③ of the graph 82). When the polarity of the magnetic poles 43B of the plate 41B positioned just in front of the magnetic pole 35E when viewed from the magnetic pole 35E as the N-pole of the magnetic gear 35 becomes S-poles, and the magnetic poles 43A of the plate 41A oriented backward when viewed from the magnetic poles 35A as the N-pole of the magnetic gear 35 still becomes S-poles. Thus, the magnetic gear 35 under revolution is rotated clockwise when viewed from the top.

Thereafter, for the group of the magnetic poles 43A, the R-phase and T-phase currents continue to be decreased, and the S-phase current continues to be increased. For the group of the magnetic poles 43B, the R-phase current continues to be decreased, the S-phase current continues to be increased, and the T-phase current is decreased up to the minimum value and then increased. Thus, the magnetic poles 43B of the plate 41A are switched from the S-pole to the N-pole (column C3, time ⑪ of the graph 81, and time ④-⑤ of the graph 82). The magnetic poles 43B of the plate 41A attracts the magnetic pole 35D as the S-pole positioned adjacent to the magnetic poles 43B in the magnetic gear 35, so that the magnetic gear 35 is forced to further rotate.

Thereafter, for the group of the magnetic poles 43A, the R-phase current continues to be decreased, the S-phase current continues to be increased, and the T-phase current is increased from the minimum value. For the group of the magnetic poles 43B, the R-phase current continues to be decreased, the S-phase current is increased up to the maximum value and then decreased, and the T-phase current is increased. Thus, the magnetic poles 43A of the plate 41A and the magnetic poles 43B of the plate 41C are brought into a non-polar state (column C4, time ⑩ of the graph 81, and time ⑥ of the graph 82). Subsequently, for the group of the magnetic poles 43A, the R-phase current continues to be decreased, the S-phase current continues to be increased, and the T-phase current continues to be increased. For the group of the magnetic poles 43B, the R-phase current is decreased up to the minimum value and then increased, the S-phase current continues to be decreased, and the T-phase current continues to be increased. Thus, the magnetic poles 43A of the plate 41A becomes the N-pole, and the magnetic poles 43B of the plate 41C becomes S-poles. The polarity of the magnetic poles 43B of the plate 41C positioned just in front of the magnetic pole 35E when viewed from the magnetic pole 35E as the N-pole of the magnetic gear 35 becomes S-poles, and the polarity of the magnetic poles 43A of the plate 41B oriented backward when viewed from the magnetic pole 35A as the N-pole of the magnetic gear 35 still becomes S-poles. Thus, the magnetic gear 35 under revolution is forced to further rotate (column C5, time ⑨ of the graph 81, and time ⑦-⑧ of the graph 82).

Thereafter, for the group of the magnetic poles 43A, the R-phase current continues to be decreased, the S-phase current is decreased from the maximum value, and the T-phase current continues to be increased. For the group of the magnetic poles 43B, the R-phase current continues to be increased, the S-phase current continues to be decreased, and the T-phase current is increased up to the maximum value and then decreased. Thus, the magnetic poles 43A of the plate 41C is brought into a non-polar state and the magnetic poles 43B of the plate 41B becomes the N-pole (column C6, time ⑧ of the graph 81, and time ⑨-⑩ of the graph 82). In addition, for the group of the magnetic poles 43A, the R-phase and S-phase currents continue to be decreased, and the T-phase current continues to be increased. For the group of the magnetic poles 43B, the R-phase current continues to be increased, the S-phase current continues to be decreased up to the minimum value, and the T-phase current continues to be decreased. Thus, the magnetic poles 43A of the plate 41C becomes S-poles, and the magnetic poles 43B of the plate 41A becomes S-poles. The polarity of the magnetic poles 43B of the plate 41A positioned just in front of the magnetic pole 35E when viewed from the magnetic pole 35E as the N-pole of the magnetic gear 35 becomes the S-pole, and the polarity of the magnetic poles 43A of the plate 41B oriented backward when viewed from the magnetic pole 35A as the N-pole of the magnetic gear 35 still becomes the S-pole. Thus, the magnetic gear 35 under revolution is forced to further rotate, so that the magnetic pole 35D as the S-pole moves close to the peripheral end portion of the rotary table 3, and the magnetic pole 35H as the S-pole moves close to the central axis of the rotary table 3 (column C7, time ⑦ of the graph 81, and time ⑪ of the graph 82).

Thereafter, for the group of the magnetic poles 43A, the R-phase current is increased from the minimum value, the S-phase current continues to be decreased, and the T-phase current continues to be increased. For the group of the magnetic poles 43B, the R-phase current continues to be increased, the S-phase current is increased from the minimum value, and the T-phase current continues to be decreased. Thus, the magnetic poles 43A of the plate 41B is brought into a non-polar state, and the magnetic poles 43B of the plate 41C becomes N-poles (column C8, time ⑥ of the graph 81, and time ⑫-① of the graph 82). In addition, for the group of the magnetic poles 43A, the R-phase current continues to be increased, the S-phase current continues to be decreased, and the T-phase current continues to be increased up to the maximum value. For the group of the magnetic poles 43B, the R-phase current is increased up to the maximum value and then is decreased, the S-phase current continues to be increased, and the T-phase current continues to be decreased. Thus, the magnetic poles 43A of the plate 41B becomes N-poles, and the magnetic poles 43B of the plate 41B becomes S-poles.

At this time, when viewed from the magnetic pole 35E as the N-pole and the magnetic pole 35D as the S-pole in the magnetic gear 35, the polarities of the magnetic poles 43B of the plates 41A positioned just in front of the magnetic pole 35E and the magnetic pole 35D become S-poles and N-poles, respectively. In addition, when viewed from the magnetic pole 35A as the N-pole of the magnetic gear 35, the magnetic poles 43A of the plate 41C oriented backward of the magnetic pole 35A becomes S-poles. When viewed from the magnetic pole 35H as the S-pole of the magnetic gear 35, the magnetic poles 43A of the plate 41A oriented backward of the magnetic pole 35H becomes N-poles. Thus, the magnetic gear 35 under revolution is forced to further rotate (column C9, time ⑤ of the graph 81, and time ②-③ of the graph 82). Subsequently, similar to the above, polarities of the group of the magnetic poles 43A and the group of the magnetic poles 43B are changed with a change in current as illustrated in graphs 81 and 82, so that the magnetic gear 35 under revolution receives magnetic forces generated by the group of the magnetic poles 43A and the group of the magnetic poles 48B. Thus, the magnetic gear 35 continues to rotate. Thereafter, the rotation of the rotary table 3 is stopped and the supply of power to the groups of the magnetic poles 43A and 47B is stopped. Thus, the revolution of the magnetic gear 35 which is not rotating, is terminated. The rotation state of the magnetic gear 35 as illustrated in FIG. 20 is an example. The rotational speed of the magnetic gear 35 in relation to a rotational speed can be adjusted by adjusting the cycle of the current and the rotational speed. As illustrated in FIGS. 18 to 20, the rotation and the revolution of the magnetic gear 35 can be performed independently of each other.

Next, an example of a film formation process performed by the film formation apparatus 1 will be described. In the example described below, the revolution and the rotation of the magnetic gear 35 are performed in parallel as illustrated in FIG. 20, on that the wafer W is subjected to the film formation process while rotating and revolving. In this film formation process, the rotation of the rotary table 3 and the rotation of the wafer holder 32 are not synchronized with each other. More specifically, when the rotary table 3 rotates once in a state where the wafer W is set to a first orientation at a predetermined position within the vacuum container 11 and subsequently, is positioned at the predetermined position again, the wafer W rotates at a rotating speed (rotational speed) at which the wafer W is set to a second orientation that is different from the first orientation.

Figure 21:
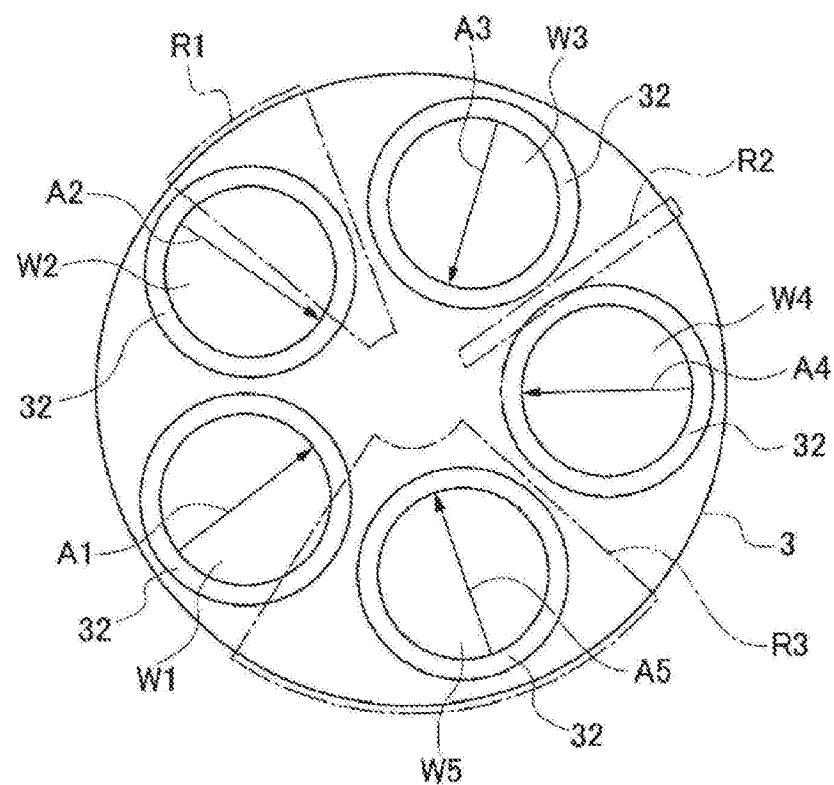
FIGS. 21 to 24 are views illustrating notate in which a film formation process is performed on a wafer.

First, the wafer W is mounted on each of the wafer holders 32 by a transfer mechanism (not illustrated) (FIG. 21). Hereinafter, descriptions will be made properly with reference to FIGS. 21 to 24 each schematically illustrating wafers W mounted on the rotary table 3. In FIGS. 21 to 24, each of the wafers W is defined as W1 to W5 for the sake of convenience in illustration. In addition, in order to indicate orientations of the wafers W displaced during the film formation process, arrows A1 to A5 directed to the center of the rotary table 3 are indicated at regions where diameters of the wafers W1 to W5 prior to the film formation process coincide with the diameter of the rotary table 3.

After the wafers W1 to W5 are mounted, the gate valve 11B is closed, the inside of the vacuum container 11 is kept in a vacuum atmosphere of a predetermined pressure by the exhaustion through the exhaust ports 38 and 39, and an $N_2$ gas is supplied to the rotary table 3 from the separation gas nozzles 62 and 65. In addition, an $N_2$ gas as a purge gas is supplied from the central region formation portion C of the rotary table 3 and a gas supply pipe (not illustrated) installed below the rotary table 3. This $N_2$ gas flows from the central portion of the rotary table 3 toward the peripheral portion. In addition, the temperatures of the heaters 16 and 19 are increased such that the rotary table 3 and the wafer holders 32 are heated by the radiant heat generated by the heaters 16 and 19. Thus, each of the wafers W1 to W5 are heated to a predetermined temperature (e.g., 600 degrees C. or more) by heat radiated from the wafer holders 32.

Figure 22:
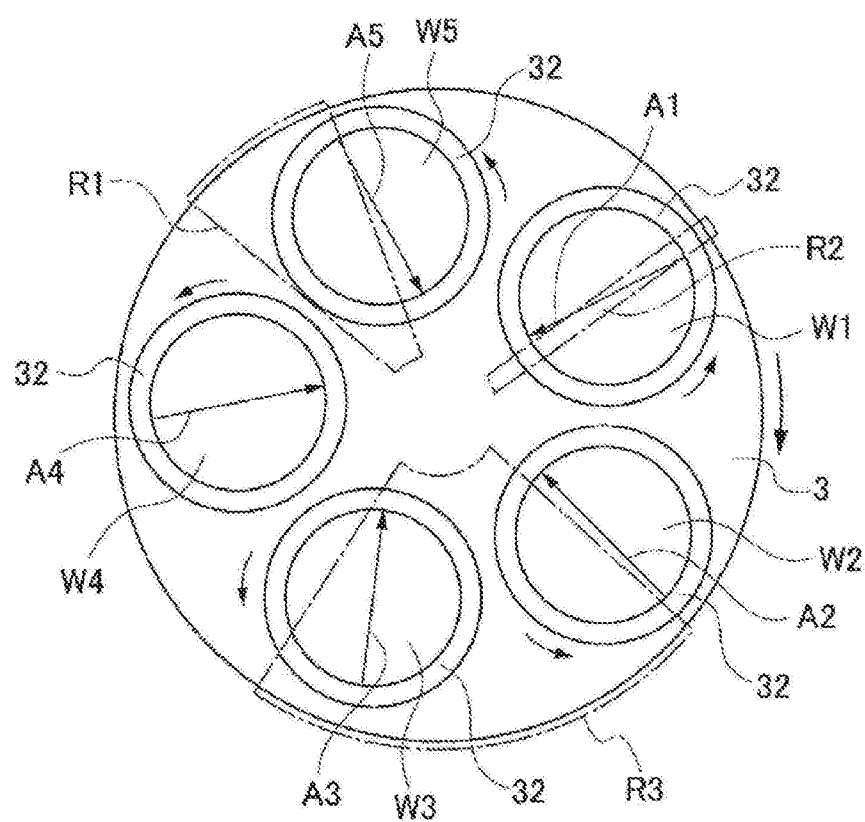

Thereafter, the rotation and revolution of the magnetic gear 35 of the rotary table 3 illustrated in FIGS. 12 to 15, and 20 (i.e. the revolution and rotation of the wafers W1 to W5 mounted on the wafer holders 32) are initiated. For example, simultaneously with the initiation of the revolution and rotation, the supply of respective gases from the raw material gas nozzle 61, the oxidizing gas nozzle 63 and the plasma generation gas nozzle 64, and the generation of plasma by the application of high frequency waves from the high frequency power source 76 to the antenna 75 are initiated. FIG. 22 illustrates a state where the orientations of the wafers W1 to W5 are displaced with the aforementioned rotation when a period of time lapses after the initiation of the film formation process and the rotary table 3 was rotated by 180 degrees from the initiation of the film formation process.

FIG. 25 indicates flows of respective gases within the vacuum container 11 by arrows. The separation region D to which an $N_2$ gas is supplied, is formed between the adsorption region R1 and the oxidization region R2. Thus, the raw material gas supplied to the adsorption region R1 and the oxidizing gas supplied to the oxidization region R2 are exhausted through the exhaust ports 39 and 38, respectively, together with the $N_2$ gas, without being mixed with each other on the rotary table 3. In addition, the separation region D to which an $N_2$ gas is supplied, is also formed between the adsorption region R1 and the plasma formation region R3. Thus, the raw material gas, the plasma generation gas supplied to the plasma formation region R3, and the oxidizing gas directed to the separation region D from the upstream side of the plasma formation region R3 in the rotational direction are exhausted through the exhaust port 39 together with the $N_2$ gas, without being mixed with each other on the rotary table 3. The $N_2$ gas supplied from the central region formation portion C is also exhausted through the exhaust ports 38 and 39.

In the state where the supply and exhaust of the respective gases have been performed as described above, the wafers W1 to W5, while rotating, sequentially and repeatedly moves through the adsorption region R1 below the nozzle cover 67 of the raw material gas nozzle 61, the oxidization region R2 below the oxidizing gas nozzle 63, and the plasma formation region R3 below the plasma forming part 71. In the adsorption region R1, the BTBAS gas discharged from the raw material gas nozzle 61 is adsorbed onto the wafers W. In the oxidization region R2, the adsorbed BTBAS gas is oxidized by the $O_3$ gas supplied from the oxidizing gas nozzle 63. Thus, one or more layers of silicon oxide molecules are formed. In the plasma formation region R3, the layers of silicon oxide molecules are exposed to plasma to be modified.

Figure 23:
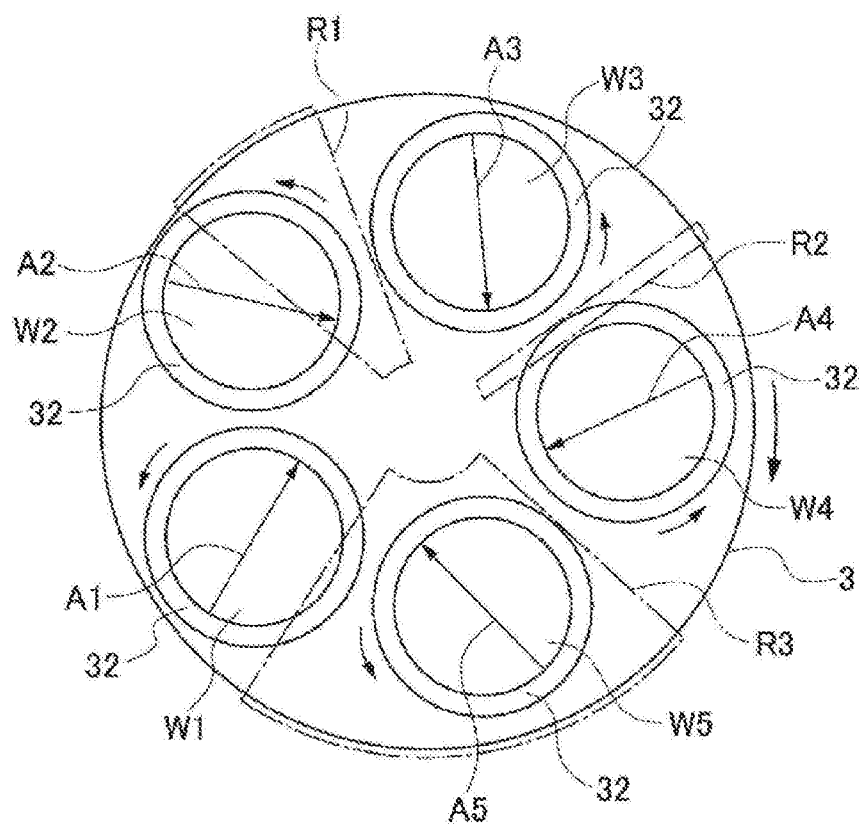
Figure 24:
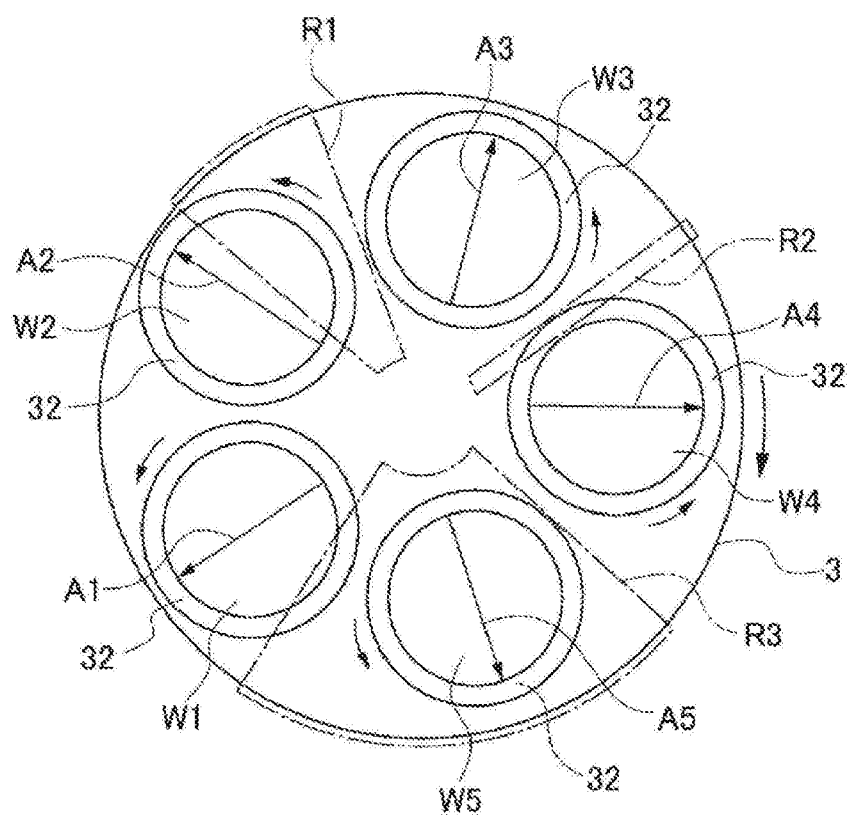

As described above, the wafer holders 32 are rotated without being synchronized with the rotation of the rotary table 3 such that the wafers W1 to W5 are oriented to different orientations whenever they reach a predetermined position of the adsorption region R1. FIG. 23 illustrates a state where the rotary table 3 is rotated once from the initiation of the film formation process. In addition, FIG. 24 illustrates a state where the rotary table 3 is further rotated from the state illustrated in FIG. 23. For example, FIG. 24 illustrates a state where each of the wafers W1 to W5 is oriented to the direction displaced by 180 degrees from the orientation at the initiation of the film formation process. As the orientations of the wafers W1 to W5 are displaced in this way, respective portions of each of the wafers W1 to W5 in the circumferential direction pass through different respective positions within the adsorption region R1. Accordingly, even if a deviation occurs in a concentration distribution of the raw material gas at the respective positions within the adsorption region R1, it is possible to uniformly keep an amount of the raw material gas adsorbed to each of the wafers W1 to W5 from the initiation of the film formation process till the termination of the film formation process in the respective portions of each of the wafers W1 to W5 in the circumferential direction. As a result, it is possible to suppress a deviation in film thickness of an $SiO_2$ film formed on each of the wafers W1 to W5 in the respective portions of each of the wafers W1 to W5 in the circumferential direction.

In this way, the rotary table 3 continues to be rotated so that the layers of the silicon oxide molecules are sequentially laminated on each of the wafers. Thus, a silicon oxide film is formed on the wafer and the thickness of the film is gradually increased. In addition, if the film formation process is performed until the thickness reaches a set target film thickness, the rotation of the rotary table 3 and the rotation of the wafer holders 32 are stopped and the film formation process is terminated. For example, at the time of terminating the film formation process, the wafers W1 to W5 are positioned at the same positions as the initial positions at the time of initiating the film formation process. The wafers W1 to W5 are oriented to the same orientations as those at the time of initiating the film formation process, respectively. Accordingly, each of the wafers W1 to W5 is laid at the position and orientation as indicated in FIG. 21, and rotates an integer number of times from the initiation of the film formation process till the termination of the film formation process.

In addition, at the time of terminating the film formation process, the supply of respective gases from the gas nozzles 61 to 65 and the formation of plasma are also stopped. Thereafter, the wafers W1 to W5 are unloaded from the inside of the vacuum container 11 by a transfer mechanism.

In the film formation apparatus 1, the wafer holders 32, the rotary shaft 33, and the bearing unit 34 are supported by the ring plate 21 equipped with the inner protrusion 21A, which constitutes the rotary shaft of the rotary table 3. In addition, the rotary shaft 33 is rotated by virtue of the magnetic force generated by the drive unit for rotation 4 so that the wafers W are rotated. Further, the ring plate 21 is rotated by virtue of the magnetic force generated by the drive unit for revolution 5 so that the rotary table 3 is rotated. With this configuration, it is possible to perform the film formation process on the wafers W at a high uniformity in the circumferential direction of the wafer W. In addition, since respective parts are supported by the ring plate 21 as described above, it is possible to prevent the weight of the wafer holders 32, the rotary shaft 33, and the bearing unit 34 from being applied to the rotary table 3. Thus, the degree of freedom of selection of a material which can be used in making the rotary table 3 is enhanced. Such an enhancement of the degree of freedom makes it possible to configure the rotary table 3 by quartz, as described above. It is therefore possible to perform the heating process on the wafer W at a relatively high temperature. As a result, it is possible to form an $SiO_2$ film having a desired film quality on the wafer W.

However, the film formation process is not limited to the process as illustrated in FIGS. 21 to 24. As an example, in the state where respective gases are supplied into the vacuum container 11 as illustrated in FIG. 25, a film formation process is performed by rotating the rotary table 3 m times such that the magnetic gears 35 are not rotated as illustrated in FIG. 19 (in a first operation S1). Here, "m" is an arbitrary number. Thereafter, for example, the supply of the raw material gas, the supply of the oxidizing gas, and the generation of plasma are temporarily stopped. Simultaneously, as illustrated in FIG. 18, in the state where the rotation of the rotary table 3 is stopped, the wafer W is rotated such that the orientation of the wafer W is displaced by, for example, 90 degrees (in a second operation S2).

Thereafter, the film formation process is performed by resuming the supply of the raw material gas, the supply of the oxidizing gas, and the generation of plasma, and rotating the rotary table 3 m times such that the magnetic gear 35 are not rotated. That is to say, the first operation S1 is performed again. In this way, the first and second operations S1 and S2 are repeated four times. In some embodiments, after the first and second operations S1 and S2 are repeated four times, these operations S1 and S2 may be further repeated four times. Even in the case where such a film formation process is performed, the orientation of the wafer W is displaced when passing through the regions R1 to R3. It is therefore possible to form a film on the wafer W at a high film thickness uniformity in the circumferential direction of the wafer W.

In addition, the orientation of the wafer W in the second operation S2 is not limited to be displaced by an angle of 90 degrees. The entire surface of the wafer W can be subjected to the film formation process at a high degree of uniformity with a smaller angle. However, in order to perform the film formation process at a high degree of uniformity in the circumferential direction of the wafer W, it is necessary to rotate the rotary table 3 m times in the first operation S1 by multiples of (360 degrees/the angle of the orientation of the wafer W to be displaced). That is to say, in the case where the orientation of the wafer W is displaced by 90 degrees, 360 degrees/90 degrees=4 so that the first operation S1 is performed 4×A (A is an integer) times.

While in the film formation apparatus 1, the three-phase alternating current as an n-phase alternating current (n is an integer) has been described to be supplied to the plate 41, the n-phase alternating current may be a two-phase alternating current, a five-phase alternating current or the like. In some embodiments, the group of the magnetic poles 43A and the group of the magnetic poles 43B may be disposed to face the lateral surface of the magnetic gear 35. That is to say, the positional relationship between the magnetic gear 35 and the group of the magnetic poles 43A and the group of the magnetic poles 43B is not limited to the example illustrated in FIG. 3 or the like. In some embodiments, the ring plate 21 may be configured to be rotated by arranging the magnets 22 around the ring plate 21, and arranging the group of the plates 51 outside the ring plate 21 to surround the ring plate 21. That is to say, the positional relationship between the magnets 22 and the group of the plates 51 is not limited to the example illustrated in FIG. 3 or the like.

Meanwhile, the substrate processing apparatus of the present disclosure is applicable to an apparatus that performs a gas process on a wafer W mounted on the rotary table 3. Accordingly, the substrate processing apparatus of the present disclosure is not limited to being applied to a film formation apparatus that performs ALD, and may be applied to a film formation apparatus that performs CVD. Further, the substrate processing apparatus of the present disclosure is not limited to being applied to the film formation apparatus. As an example, the present disclosure may be configured as a modification apparatus in which the supply of a raw material gas and an oxidizing gas through the gas nozzles 61 and 63 is not performed in the film formation apparatus 1 and only a modifying process is performed on a surface of a wafer W using the plasma forming part 71.

In addition, while in the above embodiments, the magnets 22 as magnetic bodies has been described to be installed in the ring plate 21, a metal (e.g., iron or the like) other than a magnet may be installed as the magnetic body. In such a case, a configuration may be employed in which, for example, a state where current is supplied to each plate 5 and a state where the supply of the current is stopped, are switched. In addition, the current may be supplied to only the plate 51 positioned adjacent to the front side of the magnetic body such that the plate 51 is used as magnet, and no current may be supplied to the other plates 51. In other words, the current may be supplied to only the plate 51 corresponding to the position of a magnetic body. Thus, the magnetic body is attracted forward by a magnetic force, thereby rotating the ring plate 21.

The present disclosure is not limited to a configuration in which the rotary table 3 is rotated by an electromagnet group arranged in the circumferential direction of the rotary table 3 as described above. In some embodiments, a configuration may be employed in which a driving mechanism including a motor is installed below the inner protrusion 21A that constitutes the rotary shaft of FIG. 1, thus rotating the ring plate 21 by the driving mechanism. In addition, the bearing unit 34 may include a motor for rotating the rotary shaft 33.

That is to say, the present disclosure is not limited to a configuration in which the plate 41 used as electromagnets, and the magnetic gear 35 are installed in rotating the rotary shaft 33. As an example, the electromagnets as described above may be used, and the magnetic gear 35 and the ring plate 21 may be rotated in a non-contact manner with respect to the electromagnets. This is effective to suppress the generation of particles.

Further, while in the above embodiments, the rotary shaft 33 has been described to extend downward while passing through the opening 32B formed in the recess portion of the rotary table 3, the present disclosure is not limited thereto. As an example, a configuration may be employed in which a through hole (i.e. an opening portion) having the same diameter as the wafer holder 32 is formed in the rotary table 3, the wafer holder 32 is installed within the through hole, and the upper end of the rotary shaft 33 is installed outward below the through hole to support the wafer holder 32. This case corresponds to a case where a mounting part (the wafer holder 32) is supported by a support part (the ring plate 21) through an opening portion.

Meanwhile, in the film formation apparatus 1, the rotation and revolution of the wafer W can be performed independently of one another. This makes it possible to set the number of rotations of the wafer W at a relatively low level. This setting prevents the wafer W from jumping out of the rotary table 3 by virtue of the centrifugal force of the rotation of the wafer W. In addition, when the wafer W is revolved at a relatively high speed, a process of stopping the rotation of the wafer W and changing the orientation of the wafer W at the time of stopping the revolution of the wafer W as described above, may be performed. This process makes it possible to prevent the wafer W from jumping out of the rotary table 3. In addition, even if an orientation of the wafer W at the time of initiating the rotation of the wafer W is displaced from a preset orientation due to a certain factor, the displacement may be corrected without having to rotate the wafer W. This eliminates the need to open the vacuum container 11 to perform the correction of the orientation.

In addition, in the film formation apparatus 1, it is possible to simultaneously rotate respective magnetic gears 35 by controlling the torque of five magnetic gears 35 installed in the circumferential direction of the rotary table 3 by a voltage applied to the plate 41 used as the electromagnets. Such a simultaneous rotation of the magnetic gears 35 prevents a large force from being applied in one direction in the rotary table 3, thus smoothly rotating the rotary table 3. In addition, while in the above descriptions related to the respective drawings, the rotation of the magnetic gears 35 has been described to be controlled by current, the present disclosure is not limited thereto. As an example, a voltage supplied to the plate 41 may be controlled similar to the current. Thus, it can be said that the rotation of the magnetic gears 35 is controlled by the voltage.

In addition, the magnetic gear 35 made of permanent magnets is pulled from both the central side and the peripheral side of the rotary table 3 by a magnetic force during the rotation. This suppresses the rotary shaft 33 from being tilted. Accordingly, the rotary shaft 33 is suppressed from coming in contact with other members during the revolution of the wafer W. This eliminates a need to increase a gap between the rotary shaft 33 and the other members. Thus, the degree of freedom of design of the film formation apparatus can be enhanced.

In addition, a plurality of (e.g., five) areas is set to be divided along the circumferential direction in the film formation apparatus 1. In this case, voltage may be configured to be independently supplied to the respective areas in the group of the plates 41 such that the rotation speed of the wafer W which is moving while revolving is controlled for every area. With this configuration, for example, when the wafer W passes through a sequence of the first area, the second area, the third area, the fourth area and the fifth area while revolving, a process may be performed in which the wafer W rotates at different rotation speeds, i.e., a first rotation speed, a second rotation speed, a third rotation speed, a fourth rotation speed, and a fifth rotation speed. In some embodiments, one among the first to fifth rotation speeds may be zero, that is to say, the rotation of the wafer W under revolution may be stopped at a predetermined region. In some embodiments, the adsorption region R1, the oxidization region R2 and the plasma formation region R3 for the raw material gas may correspond to different areas, and the wafer W may be configured to be rotated at different speeds when performing the adsorption and oxidization processes of the raw material gas, and a modification process by plasma. Further, when the voltage is individually supplied to the respective areas as described above, the five magnetic gears 35 may be rotated in parallel to correct orientations of the respective magnetic gears 35.

According to the present disclosure, a support port is installed below a rotary table in a rotary shaft of the rotary table, and a substrate mounting part is rotatably supported by the support part through an opening portion formed in the rotary table. With this configuration, it is possible to increase a process uniformity in a circumferential direction of the substrate, and to reduce aloud imparted to the rotary table by the mounting part and a rotating mechanism. In addition, the reduction of the load with respect to the rotary table enhances the degree of freedom for selecting a material which can be used in manufacturing the rotary table.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing a substrate by supplying a processing gas to the substrate while revolving the substrate, the substrate processing apparatus comprising:
    a rotary table installed in a processing container and having a circular recess located in an upper surface of the rotary table and an opening located in a bottom surface of the circular recess;
    a ring plate installed below the rotary table and rotatably supported by the processing container;
    a plurality of pillars extending upward from an upper surface of the ring plate and connecting the rotary table and the ring plate with each other so as to allow the rotary table to rotate with a rotation of the ring plate;
    a circular substrate holder located in the circular recess, and configured to mount the substrate on the circular substrate holder such that a height level of an upper surface of the substrate coincides with a height level of the upper surface of the rotary table; and
    a rotary shaft extending downward from a lower central portion of the circular substrate holder via the opening and rotatably supported by the ring plate so as to allow the circular substrate holder to rotate with a rotation of the rotary shaft,
    wherein an inner protrusion and an outer protrusion extending downward are formed on a bottom surface of the ring plate along a concentric circle centered at a center of the ring plate, and a lower end portion of the outer protrusion extends inward to form a flange.

2. The substrate processing apparatus of claim 1, further comprising:
    a magnetic gear connected to a lower end portion of the rotary shaft and having a plurality of magnetic poles arranged in a circumferential direction of the magnetic gear,
    an electromagnet group installed independently from the rotary table, and constituting a group of magnetic poles arranged along a circumferential direction of the rotary table; and
    a power source configured to supply a current to a coil of the electromagnet group such that the magnetic gear is rotated by a magnetic force between the plurality of magnetic poles arranged in the magnetic gear and respective magnetic poles in the electromagnet group.

3. The substrate processing apparatus of claim 1, further comprising: a first heater and a second heater separately installed inward and outward of a movement path of the rotary shaft, which is defined with a rotation of the rotary table, and configured to heat the substrate.

4. The substrate processing apparatus of claim 1, further comprising:
    magnets installed in the flange of the ring plate;
    an electromagnet group installed independently from the rotary table, and including a plurality of magnetic poles arranged along a circumferential direction of the rotary table; and
    a power source configured to supply a current to a coil of the electromagnet group such that the ring plate is rotated by a magnetic force of the respectively magnetic poles of the electromagnet group with respect to the magnets.

5. The substrate processing apparatus of claim 4, wherein the magnets are a plurality of magnetic poles installed along a rotational direction of the ring plate.

* * * * *